US007105276B2

(12) United States Patent
Fujimaki et al.

(10) Patent No.: US 7,105,276 B2
(45) **Date of Patent: *Sep. 12, 2006**

(54) IMAGE RECORDING MATERIAL

(75) Inventors: Kazuhiro Fujimaki, Shizuoka-ken (JP); Tadahiro Sorori, Shizuoka-ken (JP); Keitaro Aoshima, Shizouka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/067,698

(22) Filed: Mar. 1, 2005

(65) Prior Publication Data

US 2005/0187103 A1 Aug. 25, 2005

Related U.S. Application Data

(62) Division of application No. 09/932,975, filed on Aug. 21, 2001, now Pat. No. 6,916,595.

(30) Foreign Application Priority Data

Aug. 21, 2000 (JP) ............................. 2000-249569
Feb. 6, 2001 (JP) ............................. 2001-030043

(51) Int. Cl.
*G03F 7/027* (2006.01)
*G03F 7/029* (2006.01)

(52) U.S. Cl. ............................... 430/287.1; 430/281.1; 430/286.1; 430/302; 430/309; 430/435; 430/494; 430/944; 430/945

(58) Field of Classification Search ............ 430/270.1, 430/281.1, 282.1, 283.1, 284.1, 286.1, 287.1, 430/288.1, 302, 309, 434, 435, 494, 944, 430/945
See application file for complete search history.

(56) References Cited

U.S. PATENT DOCUMENTS

| | | | | |
|---|---|---|---|---|
| 4,710,445 | A | 12/1987 | Sanders | |
| 5,043,396 | A | 8/1991 | Kitahara et al. | |
| 6,153,356 | A | 11/2000 | Urano et al. | |
| 6,083,658 | A1 | 7/2001 | Kunita et al. | |
| 6,309,792 | B1 | 10/2001 | Hauck et al. | |
| 6,410,208 | B1 | 6/2002 | Teng | |
| 6,475,700 | B1 | 11/2002 | Higashi et al. | |
| 6,566,035 | B1 | 5/2003 | Aoshima | |
| 6,660,446 | B1 | 12/2003 | Shimada et al. | |
| 6,692,896 | B1 | 2/2004 | Shimada et al. | |
| 2002/0048722 | A1 | 4/2002 | Aoshima | |
| 2002/0086238 | A1 | 7/2002 | Fujimaki et al. | |
| 2002/0177074 | A1 | 11/2002 | Hoshi et al. | |
| 2002/0182539 | A1 | 12/2002 | Fujimaki et al. | |
| 2003/0073032 | A1 | 4/2003 | Aoshima | |
| 2003/0146965 | A1 | 8/2003 | Fujimaki et al. | |
| 2003/0215745 | A1 | 11/2003 | Fujimaki | |
| 2003/0232280 | A1 * | 12/2003 | Goto | 430/284.1 |
| 2004/0009426 | A1 * | 1/2004 | Goto et al. | 430/270.1 |

FOREIGN PATENT DOCUMENTS

| | | | |
|---|---|---|---|
| EP | 0 897 795 | A1 | 2/1999 |
| EP | 0 919 868 | A1 | 6/1999 |
| EP | 1 091 247 | A2 | 4/2001 |
| EP | 1 110 747 | A1 | 6/2001 |
| EP | 1 162 078 | A2 | 12/2001 |
| EP | 1 176 007 | A2 | 1/2002 |
| EP | 1 182 033 | A1 | 2/2002 |
| EP | 1 186 407 | A1 | 3/2002 |
| EP | 1 211 096 | A1 | 6/2002 |
| EP | 1 285 749 | A2 | 2/2003 |
| EP | 1 285 751 | A2 | 2/2003 |
| EP | 1 291 718 | A2 | 3/2003 |
| EP | 1 332 870 | A2 | 8/2003 |
| EP | 1 334 824 | A2 | 8/2003 |
| EP | 1 341 040 | A1 | 9/2003 |
| JP | 6-1088 | A | 1/1994 |
| JP | 8-108621 | | 4/1996 |
| JP | 9-034110 | | 2/1997 |
| JP | 9-43845 | A | 2/1997 |
| JP | 9-43847 | A | 2/1997 |
| JP | 2001-133969 | | 5/2001 |
| JP | 2001-312062 | | 11/2001 |
| WO | 97/46385 | A1 | 12/1997 |

* cited by examiner

*Primary Examiner*—Barbara L. Gilliam
(74) *Attorney, Agent, or Firm*—Buchanan Ingersoll PC

(57) ABSTRACT

A heat mode type negative image recording material is provided which comprises (A) a polymer compound that is insoluble in water but is soluble in an alkali aqueous solution and has at least one of groups represented by general formulae (1) to (3) on a side chain; (B) a photothermal conversion agent; and (C) an onium salt compound forming radicals by heat mode exposure with light that is capable of being absorbed by said photothermal conversion agent (B), said heat mode type negative image recording material being capable of recording an image by heat mode exposure. The general formulae are defined in the specification.

12 Claims, No Drawings

IMAGE RECORDING MATERIAL

This application is a division of application Ser. No. 09/932,975, filed Aug. 21, 2001, now U.S. Pat. No. 6,916,595 which claims priority under 35 U.S.C. §119 to Japanese Applications No. 2000-249569 and 2001-30043 filed on Aug. 21, 2000 and Feb. 6, 2001, respectively.

BACKGROUND OF THE INVENTION

1. Field of the Invention

The present invention relates to a negative image recording medium capable of being recorded by infrared laser, and more particularly, it relates to a negative image recording material in which an image part of a recording layer has high strength and which is capable of forming a lithographic printing plate excellent in printing durability.

2. Description of the Related Art

Laser technologies have been greatly developed in recent years, and particularly, a solid laser and a semiconductor laser which have an emission region over a near infrared ray region to an infrared ray region have become powerful and smaller in size. Therefore, these laser technologies are useful as an exposure light source for producing plates directly from digital data from, for example, computers.

A material for a negative lithographic printing plate for an infrared laser, to which an infrared laser having an emission region over a near infrared ray region to an infrared ray region is applied as an exposure light source, has a photosensitive layer containing an infrared ray absorbent, a polymerization initiator generating radicals by light or heat, and a polymerizable compound.

In general, the negative image recording material utilizes a recording method in which a polymerization reaction is caused by radicals which are initiator and are generated due to light or heat. The recording layer is thereby hardened in the exposed part to form an image part. The negative image recording material has low image forming property in comparison to a positive type causing solubilization of a recording layer due to energy from infrared laser irradiation, and a heat treatment is generally carried out before a developing step in order to form a firm image part by accelerating the hardening reaction through polymerization.

As such a printing plate that has a recording layer polymerizable by light or heat, techniques using a photopolymerizable composition or a heat polymerizable composition in a photosensitive layer have been known as described in JP-A-8-108621 and JP-A-9-34110. While the photosensitive layers are excellent in high sensitive image forming property, the adhesion at an interface between the photosensitive layer and a support is low in the case where a substrate that has been subjected to a hydrophilic treatment is used, whereby such a problem occurs that the printing durability is poor.

Furthermore, while the use of an infrared laser of high output is considered to increase the sensitivity, it causes such a problem that ablation of the photosensitive layer occurs at the time of scanning by the laser to thereby contaminate the optical system.

SUMMARY OF THE INVENTION

The invention has been developed taking the foregoing problems into consideration, and an object of the invention is to provide a negative image recording material in which ablation is suppressed when laser scanning is carried out at the time of recording, in which an image part thus formed is high in strength, and which is also capable of forming a lithographic printing plate excellent in printing durability.

Research by the inventors determined that when a resin having a specific unsaturated bond group is used as a polymer compound that is insoluble in water but is soluble in an alkali aqueous solution, recording can be carried out in which an image part is excellent in strength. This discovery led to the completion of the present invention.

One aspect of the invention relates to a heat mode type negative image recording material comprising (A) a polymer compound that is insoluble in water but is soluble in an alkali aqueous solution and has at least one of groups represented by the following general formulae (1) to (3) on a side chain; (B) a photothermal conversion agent; (C) an onium salt compound which forms radicals by heat mode exposure with light that is capable of being absorbed by the photothermal conversion agent (B); and optionally (D) a radical polymerizable compound, and which is capable of recording an image by heat mode exposure:

General formula (1)

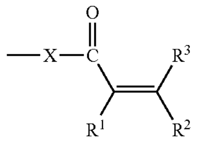

General formula (2)

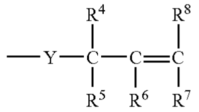

General formula (3)

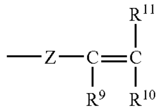

wherein $R^1$ to $R^{11}$ each independently represents a monovalent organic group; X and Y each independently represents an oxygen atom, a sulfur atom or —N($R^{12}$)—; Z represents an oxygen atom, a sulfur atom, —N($R^{12}$)— or a phenylene group; and $R^{12}$ represents a hydrogen atom or a monovalent organic group.

While the way the invention works is not completely clear, the mechanism is considered to be as follows. The image recording material of the invention uses the resin (A) having at least one of groups represented by the following general formulae (1) to (3) on a side chain as a polymer compound that is insoluble in water but is soluble in an alkali aqueous solution. Because the polymer compound has a side chain substituent having high radical reactivity, when the image recording material is used in a photosensitive layer of a heat mode type lithographic printing plate original, a crosslinking reaction is caused immediately after scanning exposure with infrared laser, so as to form a hardened film having a high crosslinking density. As a result, it suppresses ablation of other low molecular weight component in the photosensitive layer, such as a photothermal conversion agent, and prevents their release from the photosensitive layer, and contamination of the optical system, such as a spinner mirror, is thus suppressed.

Furthermore, a heat mode type lithographic printing plate original has the following problem. While the plate original uses an aluminum substrate as a support in many cases, heat caused by the heat mode exposure is not sufficiently transmitted to the photosensitive layer in the vicinity of the substrate owing to heat diffusion property of aluminum, and as a result, the hardening reaction is not sufficiently carried out in the vicinity of the interface between the photosensitive layer and the support. When a latent image formed under such circumstances is developed by using an alkali developing solution, the developing solution easily penetrates from the upper part of the hardened photosensitive layer to dissolve the unhardened part in the vicinity of the interface. Therefore, the strength of the image is deteriorated to form a lithographic printing plate of low printing durability. On the other hand, when the polymer compound used in the invention is used as a binder of the photosensitive layer, the crosslinking density in the hardened part is increased, and the penetration of the developing solution can be effectively suppressed. Therefore, the damages received by the image part can be lessened to improve the printing durability.

The effect of the polymer compound (A) used in the invention is remarkable when the onium salt compound (C) is used as a compound which forms radicals by heat mode exposure with light capable of being absorbed by the photothermal conversion agent. It is considered that this is caused by excellent compatibility between the polymer compound and the onium salt compound.

The invention also relates to, as another aspect, a heat mode type negative image recording material comprising (A') a polymer compound that is insoluble in water but is soluble in an alkali aqueous solution and has at least one of structural units represented by the following general formulae (4) and (5) in an amount of 30 mol % or more; (B) a photothermal conversion agent; and (C') a compound forming radicals by heat mode exposure with light that is capable of being absorbed by the photothermal conversion agent (B), said heat mode type negative image recording material being capable of recording an image by heat mode exposure:

General formula (4)

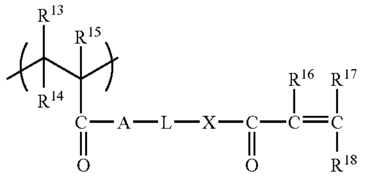

General formula (5)

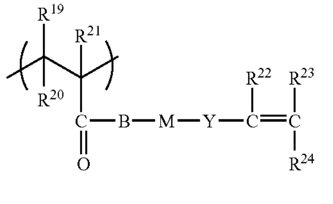

wherein A, B and X each independently represents an oxygen atom, a sulfur atom or —N($R^{25}$)—; L and M each independently represents a divalent organic group; $R^{13}$ to $R^{24}$ each independently represents a monovalent organic group; Y represents an oxygen atom, a sulfur atom, —N($R^{26}$)— or a phenylene group, which may have a substituent; and $R^{25}$ and $R^{26}$ each independently represents a hydrogen atom or a monovalent organic group.

In the image recording material of this aspect of the invention, a polymer compound having at least one of structural units represented by the foregoing general formulae (4) and (5) is used as a polymer compound functioning as a binder in an amount of 30 mol % or more. While not completely clear, the effect thereof will be described below. In particular, the effect where an image recording material using the binder is used as a photosensitive layer of a heat mode type lithographic printing plate original will be described.

Since the structural units represented by the general formulae (4) and (5) have a functional group having high radical reactivity, a crosslinking reaction immediately occurs among the polymer binder after generating radicals by scanning exposure with infrared laser. When the structural units are contained in an amount of 30 mol % or more of the polymer composition, formation of a hardened film, i.e., insolubilization to a developer solution and an organic solvent, rapidly occurs.

Generally, in most cases of formation of a hardened film utilizing radical polymerization, an oxygen blocking layer (protective layer) is provided as an upper layer of a photosensitive layer for suppressing inhibition of radical polymerization due to oxygen from outside the system in order to sufficiently carry out the reaction, and thus obtain a hardened film of sufficient strength. In the case where the binder of the invention is used, substantially no polymerization inhibition due to oxygen occurs. Therefore, the invention has such an advantage that there is no necessity of providing an oxygen blocking layer.

In the case where the content of the structural units is less than 30 mol %, a hardened film is formed, but the strength thereof is insufficient. When no protective layer is provided, images having printing durability sufficient for practical use are not obtained when the image recording material is used as a photosensitive layer of a heat mode type lithographic printing plate original. When the amount is 30 mol % or more, the actual effect of oxygen can be disregarded, and thus sufficient strength of the hardened film can be obtained without providing a protective layer.

Furthermore, it is considered that the polymer compound of the invention causes a crosslinking reaction immediately after generating radicals due to scanning exposure with infrared laser to form a hardened film having a high crosslinking density, and thus it suppresses ablation of other low molecular weight component in the photosensitive layer, such as a photothermal conversion agent, and thus suppresses their release from the photosensitive layer, whereby contamination of the optical system is suppressed.

The structural units contained improves the compatibility between the binder polymer and other components constituting the image recording material, such as a compound generating radicals. Therefore, it is considered that phase separation of the composition with the lapse of time is suppressed, and thus the storage stability is excellent.

The term "heat mode type" referred in the invention refers to capability of recording by heat mode exposure. The definition of the heat mode exposure used in the invention will be described in more detail. As described in Hans-Joachim Timpe, IS&Ts NIP 15:1999 International Conference on Digital Printing Technologies, p. 209, it is known that the process starting with photoexcitation of a light absorbing substance forming an image (such as a dye) in a photosensitive material and ending with chemical or physical change of the light absorbing substance is generally classified into two modes. One of the modes is the so-called photon mode, in which the photoexcited light absorbing substance is made inactive through a photochemical interaction (such as energy transfer and electron transfer) with another reactive substance in the photosensitive material, and as a result, the activated reactive substance causes chemical or physical change necessary for the image formation. The other mode is the heat mode, in which the photoexcited light absorbing substance is made inactive through generation of heat, and a reactive substance causes chemical or physical change necessary for the image formation by utilizing the heat. In addition to these, there are some special modes, such as ablation, in which a substance is explosively scattered by locally condensed light energy, and multiphoton absorption, in which a large number of photons are absorbed by one molecule, but these modes are not included herein.

Exposure processes using the forgoing modes are referred to as photon mode exposure and heat mode exposure, respectively. The technical difference between the photon mode exposure and the heat mode exposure resides in whether or not the energy amount of each of the photons used in exposure can be accumulated in obtaining the energy amount of the desired reaction. For example, consider the case where a certain reaction is carried out by using n photons. Since the photon mode exposure utilizes photochemical interaction, the energy of each photon cannot be accumulated and then used at once due to the principle of conservation of energy and momentum of quantum. In other words, in order to carry out a certain reaction, the energy amount of one photon must be equal to or greater than the energy amount of the reaction. In the heat mode exposure, on the other hand, since heat is generated after photoexcitation and the light energy is utilized after being converted to heat, the energy amount can be accumulated. Therefore, it is sufficient for the total energy amount of n photons to be equal to or greater than the energy amount of the reaction. However, the accumulation of the energy amount is affected by heat diffusion. That is, in the case where heat is generated at an exposure point (reaction point), and the next generation of heat through the photoexcitation and inactivation process occurs before the heat of the first reaction escapes by heat diffusion, accumulation of heat can be ensured, thereby increasing the temperature at the point. However, the heat will escape and does not accumulate if the next generation of heat is delayed. Consequently, the case where light having a high energy amount is exposed for a short period of time and the case where light having a low energy amount is exposed for a long period of time give different results even when heat mode exposure with the same total amount of exposure energy is carried out. The former case, i.e., the case where the exposure period is short, is advantageous for accumulation of heat.

In the photon mode exposure, due to the effect of some types of subsequent reactions, a phenomenon similar to that described above may occur, but basically this phenomenon does not occur in photon mode exposure.

From the standpoint of the characteristics of a photosensitive material, in the photon mode, the inherent sensitivity (energy amount for a reaction required for image formation) of the photosensitive material is constant with respect to the exposure power density ($w/cm^2$) (i.e., energy density per unit period of time), whereas in the heat mode, the inherent sensitivity of the photosensitive material is increased with respect to the exposure power density. Therefore, in practical use of an image recording material, when the respective modes are compared given an exposure time sufficient for maintaining necessary productivity, the photon mode exposure realizes high sensitivity of about 0.1 $mJ/cm^2$. However, since the reaction is induced by even small amount of light, a problem of low exposure fogging in an unexposed region is liable to occur. In the heat mode exposure, on the other hand, the reaction does not occur unless the exposure amount reaches a certain value. The problem of low exposure fogging can be avoided but an exposure power density of about 50 $mJ/cm^2$ is generally necessary for the heat stability of the photosensitive material.

In fact, an exposure power density of 5,000 $w/cm^2$ or more and preferably 10,000 $w/cm^2$ or more on the plate surface is necessary in the heat mode exposure. However, while not described in detail herein, when a high power density laser of $5.0\times10^5$ $w/cm^2$ is used, ablation occurs thereby causing problems, such as contamination of a light source.

PREFERABLE EMBODIMENTS OF THE INVENTION

The invention will be described in more detail below.

The negative image recording material of the invention comprises (A) a polymer compound that is insoluble in water but is soluble in an alkali aqueous solution and has at least one of groups represented by the general formulae (1) to (3) on a side chain; (B) a photothermal conversion agent; (C) an onium salt compound forming radicals by heat mode exposure with light that is capable of being absorbed by the photothermal conversion agent (B). The compounds that can be used in the image recording material of the invention will be respectively described below.

(A) Alkali Soluble Resin

The polymer compound that is insoluble in water but is soluble in an alkali aqueous solution and has at least one of groups represented by the general formulae (1) to (3) on a side chain (hereinafter sometimes referred to as a particular alkali soluble resin) will be described.

In the general formula (1), $R^1$ to $R^3$ each independently represents a monovalent organic group. Examples of $R^1$ include a hydrogen atom and an alkyl group, which may have a substituent, and among these, a hydrogen atom, a methyl group, a methylalkoxy group and a methylester group are preferable. Examples of $R^2$ and $R^3$ independently include a hydrogen atom, a halogen atom, an amino group, a dialkylamino group, a carboxyl group, an alkoxycarbonyl group, a sulfo group, a nitro group, a cyano group, an alkyl group, which may have a substituent, an aryl group, which may have a substituent, an alkoxy group, which may have a substituent, an aryloxy group, which may have a substituent, an alkylamino group, which may have a substituent, an arylamino group, which may have a substituent, an alkylsulfonyl group, which may have a substituent, and an arylsulfonyl group, which may have a substituent, and among these, a hydrogen atom, a carboxyl group, an alkoxycarbonyl group, an alkyl group, which may have a substituent, and an aryl group, which may have a substituent, are preferable.

Examples of the substituent that can be introduced include a methoxycarbonyl group, an ethoxycarbonyl group, an isopropyloxycarbonyl group, a methyl group, an ethyl group, a phenyl group and the like.

X represents an oxygen atom, a sulfur atom or —$N(R^{12})$—, and examples of $R^{12}$ include an alkyl group, which may have a substituent.

In the general formula (2), $R^4$ to $R^8$ each independently represents a monovalent organic group. Examples of $R^4$ to $R^8$ include a hydrogen atom, a halogen atom, an amino group, a dialkylamino group, a carboxyl group, an alkoxycarbonyl group, a sulfo group, a nitro group, a cyano group, an alkyl group, which may have a substituent, an aryl group, which may have a substituent, an alkoxy group, which may have a substituent, an aryloxy group, which may have a substituent, an alkylamino group, which may have a substituent, an arylamino group, which may have a substituent, an alkylsulfonyl group, which may have a substituent, and an arylsulfonyl group, which may have a substituent. Among these, a hydrogen atom, a carboxyl group, an alkoxycarbonyl group, an alkyl group, which may have a substituent, and an aryl group, which may have a substituent, are preferable. Examples of the substituent that can be introduced include those given as examples in the general formula (1). Y represents an oxygen atom, a sulfur atom or —N($R^{12}$)—, and examples of $R^{12}$ include those given as examples in the general formula (1).

In the general formula (3), $R^9$ to $R^{11}$ each independently represents a monovalent organic group. Examples of the organic group include such as a hydrogen atom, a halogen atom, an amino group, a dialkylamino group, a carboxyl group, an alkoxycarbonyl group, a sulfo group, a nitro group, a cyano group, an alkyl group, which may have a substituent, an aryl group, which may have a substituent, an alkoxy group, which may have a substituent, an aryloxy group, which may have a substituent, an alkylamino group, which may have a substituent, an arylamino group, which may have a substituent, an alkylsulfonyl group, which may have a substituent, and an arylsulfonyl group, which may have a substituent. Among these, a hydrogen atom, a carboxyl group, an alkoxycarbonyl group, an alkyl group, which may have a substituent, and an aryl group, which may have a substituent, are preferable.

Examples of the substituent include those given as examples in the general formula (1).

Z represents an oxygen atom, a sulfur atom, —N($R^{12}$)— or a phenylene group. Examples of $R^{12}$ include those given as examples in the general formula (1).

Examples of the polymer skeleton structure of the particular alkali soluble resin (A), which is an essential component of the heat mode type negative image recording material of the invention include a poly(meth)acrylate resin, a polyurethane resin, an acetal modified polyvinyl alcohol resin and a polyimide resin, and among these, a poly(meth) acrylate resin is preferable.

The side chain groups represented by the general formulae (1) to (3) are preferably bonded to the polymer main chain through a linear or branched alkylene group.

The compound having the group represented by the general formula (1) used as an example of the particular alkali soluble resin (A), which is an essential component of the heat mode type negative image recording material of the invention, can be manufactured by at least one of the following synthesis methods (1) and (2).

Synthesis Method (1)

One or more kinds of a radical polymerizable compound represented by the following general formula (6) is polymerized to form a polymer compound, and then the proton is abstracted to release Z by using a base, so as to obtain the desired polymer compound.

General formula (6)

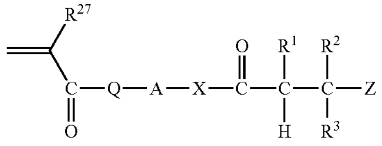

wherein Z represents an anionic releasing group; Q represents an oxygen atom, —NH— or —$NR^{28}$— (wherein $R^{28}$ represents an alkyl group, which may have a substituent); $R^{27}$ represents a hydrogen atom or an alkyl group, which may have a substituent, with a hydrogen atom, a methyl group, a methylalkoxy group and a methylester group being preferable among these; and A represents a divalent organic linking group.

Synthesis Method (2)

One or more kinds of a radical polymerizable compound having a functional group is polymerized to synthesize a backbone polymer compound (polymer compound constituting the main chain), and then the side chain functional group of the backbone polymer compound and a compound having the structure represented by the following general formula (7) are allowed to react, so as to obtain the desired polymer compound.

General formula (7)

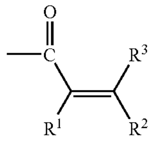

Examples of the radical polymerizable compound represented by the general formula (6) include the following compounds, but it is not limited thereto.

(M-1)

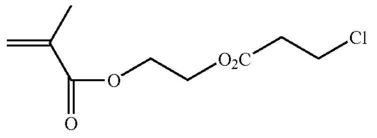

(M-2)

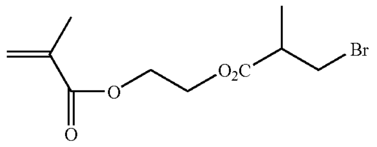

(M-3)

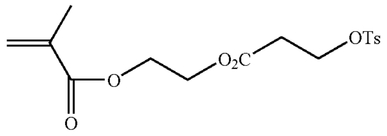

(M-4)

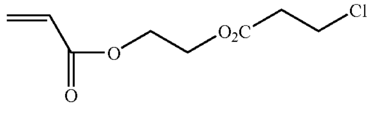

-continued (M-5)

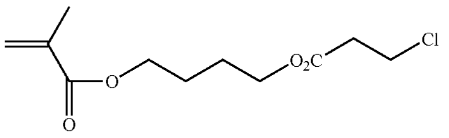

(M-6)

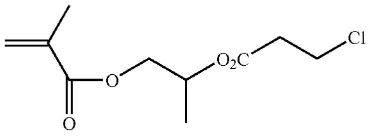

(M-7)

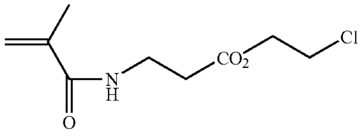

(M-8)

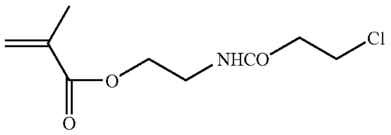

(M-9)

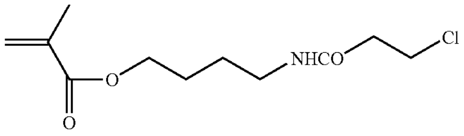

(M-10)

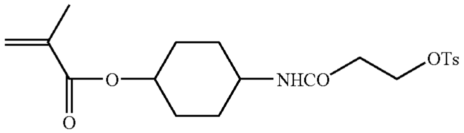

(M-11)

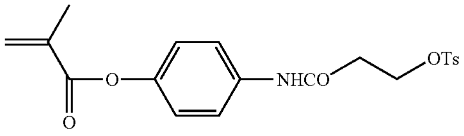

(M-12)

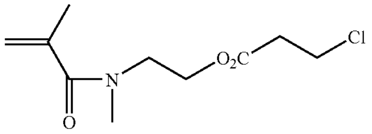

The radical polymerizable compound represented by the general formula (6) is available as a commercial product or can be manufactured by synthesis method shown in the synthesis examples below.

One or more kinds of the radical polymerizable compound and, according to need, another radical polymerizable compound are polymerized by the general radical polymerization process to obtain a polymer compound, and then the group represented by the general formula (1) can be introduced therein in the following manner. A desired amount of a base is added dropwise to a solution of the polymer compound under cooling or heating conditions, and then, according to need, is neutralized with an acid. The production of the polymer compound can be carried out by a known process, such as a suspension polymerization process or a solution polymerization process.

Examples of the base include both an inorganic compound and an organic compound. Preferable examples of the inorganic base include sodium hydroxide, potassium hydroxide, sodium carbonate, sodium bicarbonate, potassium carbonate and potassium bicarbonate. Examples of the organic base include a metallic alkoxide, such as sodium methoxide, sodium ethoxide and potassium t-butoxide, and an organic amine compound, such as triethylamine, pyridine, diisopropylethylamine.

Examples of the functional group of the radical polymerizable compound having a functional group used in the synthesis of the backbone polymer compound in the synthesis method (2) include a hydroxyl group, a carboxyl group, a carboxylic acid halide group, a carboxylic acid anhydride group, an amino group, a halogenated alkyl group, an isocyanate group, an epoxy group and the like. Examples of the radical polymerizable compound having these functional groups include 2-hydroxyethyl acrylate, 2-hydroxyethyl methacrylate, 4-hydroxybutyl acrylate, 4-hydroxybutyl methacrylate, acrylic acid, methacrylic acid, acrylic chloride, methacrylic acid chloride, methacrylic acid anhydride, N,N-dimethyl-2-aminoethyl methacrylate, 2-chloroethyl methacrylate, 2-ethyl isocyanate methacrylate, glycidyl acrylate, glycidyl methacrylate and the like.

One or more kinds of these radical polymerizable compounds are polymerized, and according to need, another radical polymerizable compound is copolymerized, so as to form the backbone polymer compound. Thereafter, the backbone polymer compound is allowed to react with the compound having the group represented by the general formula (13) to obtain the desired polymer compound.

Examples of the compound having the group represented by the general formula (13) include those given as examples in the radical polymerizable compound having a functional group.

The compound having the group represented by the general formula (2) can be manufactured by at least one of the following synthesis methods (3) and (4).

Synthesis Method (3)

One or more kinds of a radical polymerizable compound having an unsaturated group represented by the general formula (2) and an ethylenic unsaturated group having higher addition polymerizability than the unsaturated group and, according to need, another radical polymerizable compound are polymerized to obtain a polymer compound. This method uses, for example, a compound having plural ethylenic unsaturated groups having different degrees of addition polymerizability in one molecule, such as allyl methacrylate.

Synthesis Method (4)

One or more kinds of a radical polymerizable compound having a functional group is polymerized to form a polymer compound, and then the side chain functional group is allowed to react with a compound having a structure represented by the following general formula (8), so as to introduce the group represented by the general formula (2).

General formula (8)

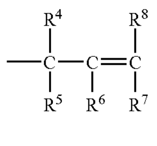

Examples of the radical polymerizable compound having the unsaturated group represented by the general formula (2) and an ethylenic unsaturated group having higher addition polymerizability than the unsaturated group include allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallyl methacrylate, allylacrylamide, allylmethacrylamide and the like.

Examples of the polymer compound obtained by polymerizing one or more kinds of a radical polymerizable compound having a functional group include those given as examples in the synthesis method (2).

Examples of the compound having a structure represented by the general formula (8) include allylalcohol, allylamine, diallylamine, 2-allyloxyethyl alcohol, 2-chloro-1-butene, allylisocyanate and the like.

The compound having the group represented by the general formula (3) can be manufactured by at least one of the following synthesis methods (5) and (6).

Synthesis Method (5)

One or more kinds of a radical polymerizable compound having an unsaturated group represented by the general formula (3) and an ethylenic unsaturated group having higher addition polymerizability than the unsaturated group is polymerized, and according to need, another radical polymerizable compound is copolymerized, so as to obtain a polymer compound.

Synthesis Method (6)

One or more kinds of a radical polymerizable compound having a functional group is polymerized to form a polymer compound, and then the side chain functional group is allowed to react with a compound having a structure represented by the following general formula (9), so as to introduce the group represented by the general formula (3).

General formula (9)

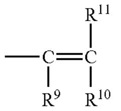

Examples of the radical polymerizable compound having the unsaturated group represented by the general formula (3) and an ethylenic unsaturated group having higher addition polymerizability than the unsaturated group include vinyl acrylate, vinyl methacrylate, 2-phenylvinyl acrylate, 2-phenylvinyl methacrylate, 1-propenyl acrylate, 1-propenyl methacrylate, vinyl acrylamide, vinyl methacrylamide and the like.

Examples of the polymer compound obtained by polymerizing one or more kinds of a radical polymerizable compound having a functional group include those given as examples in the synthesis method (2).

Examples of the compound having a structure represented by the general formula (9) include 2-hydroxyethyl monovinyl ether, 4-hydroxybutyl monovinyl ether, diethyleneglycol monovinyl ether, 4-chloromethylstyrene and the like.

Representative synthesis examples and (A) specific polymer compounds of the particular alkali soluble resin of the invention will be described below, but the invention is not limited thereto.

Synthesis of Radical Polymerizable Compound (1) Synthesis of Compound (M-1)

A solution containing 133 g of 2-hydroxyethyl methacrylate in 520 ml of THF was prepared in a 1,000-ml three-neck flask and cooled to 0° C. 130 g of 3-chloropropionic acid chloride was added dropwise thereto while stirring over one hour, and the temperature of the mixture was gradually increased to room temperature. After stirring at room temperature for 12 hours, the reaction mixture was put in 1 L of iced water. After stirring for one hour, the reaction mixture was extracted three times with 2 L of ethyl acetate, and the resulting organic layer was washed with water, a saturated sodium bicarbonate aqueous solution and a saturated saline solution in this order and then dried over magnesium sulfate. After filtration, the solvent was distilled off under reduced pressure by a rotary evaporator. The resulting residual matter was purified by silica gel column chromatography (elution solvent: hexane/ethyl acetate) to obtain 180 g of the compound (M-1). The structure of the compound (M-1) was checked by NMR, mass spectroscopy and IR spectroscopy.

(2) Synthesis of Compound (M-5)

The compound (M-5) was synthesized in the same manner as in the synthesis of the compound (M-1) except that 4-hydroxybutyl methacrylate was used instead of 2-hydroxyethyl methacrylate.

(3) Synthesis of Compound (M-8)

A solution containing 49 g of ethanolamine in 500 ml of THF was prepared in a 1,000-ml three-neck flask and cooled to 0° C. 51 g of 3-chloropropionic acid chloride was added dropwise thereto while stirring over one hour, and the temperature of the mixture was gradually increased to room temperature. After stirring at room temperature for 12 hours, the mixture was filtered, and the solvent was distilled off under reduced pressure. 10 g of the resulting residual matter was put in a 100-ml three-neck flask and dissolved with 50 ml of THF, and then cooled to 0° C. 7 g of methacrylic acid chloride was added dropwise while stirring over 30 minutes, and the temperature of the mixture was gradually increased to room temperature. After stirring at room temperature for 12 hours, the reaction mixture was put in 300 ml of iced water. After stirring for one hour, the mixture was extracted three times with 1 L of ethyl acetate, and the resulting organic layer was washed with water, a saturated sodium bicarbonate aqueous solution and a saturated saline solution in this order and then dried over magnesium sulfate. After filtration, the solvent was distilled off under reduced pressure by a rotary evaporator. The resulting residual matter was purified by silica gel column chromatography (elution solvent: hexane/ethyl acetate) to obtain 8 g of the compound (M-8). The structure of the compound (M-8) was checked by NMR, mass spectroscopy and IR spectroscopy.

(4) Synthesis of Compound (M-9)

The compound (M-9) was synthesized in the same manner as in the synthesis of the compound (M-8) except that 4-hydroxy-1-butylamine was used instead of ethanolamine.

Synthesis of Polymer Compound

Synthesis examples of the polymer compounds (1) to (23) shown in the following Tables 1 to 5 will be described below.

SYNTHESIS EXAMPLE 1

Synthesis of Polymer Compound (1)

80 ml of 1-methoxy-2-propanol was put in a 500-ml three-neck flask equipped with a condenser and a stirrer and was heated to 70° C. Under a nitrogen stream, a solution of 53.0 g of the compound (M-1), 5.2 g of methacrylic acid and 0.746 g of V-65 (manufactured by Wako Pure Chemical Industries, Ltd.) in 80 ml of 1-methoxy-2-propanol was added dropwise thereto over 2.5 hours. The mixture was further allowed to react at 70° C. for two hours. After the reaction mixture was diluted with 100 ml of 1-methoxy-2-propanol and cooled to 0° C., 33.4 g of triethylamine was added dropwise while stirring, and the mixture was allowed to react for 12 hours with the temperature being gradually increased to room temperature. After cooling the reaction mixture to 0° C., a 5M HCl was added dropwise to the reaction mixture while stirring until the pH of the reaction mixture reached 6 or less. The reaction mixture was put in 3 L of water to deposit a polymer. The polymer was filtered, washed and dried to obtain the polymer compound (1). It was confirmed by NMR spectrum that all the groups derived from the compound (M-1) were converted to acrylic groups. The weight average molecular weight of the resulting polymer compound was measured by gel permeation chromatography (GPC) using polystyrene as a standard, and it found to be 80,000.

SYNTHISIS EXAMPLE 2

Synthesis of Polymer Compound (2)

90 ml of methyl ethyl ketone was put in a 500-ml three-neck flask equipped with a condenser and a stirrer and was heated to 70° C. Under a nitrogen stream, a solution of 15.6 g of 2-hydroxyethyl methacrylate, 5.2 g of methacrylic acid, 12.0 g of methyl methacrylate and 0.775 g of V-65 (manufactured by Wako Pure Chemical Industries, Ltd.) in 90 ml of methyl ethyl ketone was added dropwise thereto over 2.5 hours. The mixture was further allowed to react at 70° C. for two hours. After the reaction mixture was cooled to 0° C., 10.9 g of acrylic acid chloride was added dropwise while stirring, and the mixture was allowed to react for 12 hours with the temperature being gradually increased to room temperature. The reaction mixture was put in 3 L of water to deposit a polymer. The polymer was filtered, washed and dried to obtain the polymer compound (2). It was confirmed by NMR spectrum that acrylic groups were introduced to the side chain by a polymer reaction. The weight average molecular weight of the resulting polymer compound was measured by gel permeation chromatography (GPC) using polystyrene as a standard, and found to be 78,000.

SYNTHISIS EXAMPLE 3

Synthesis of Polymer Compound (3)

200 ml of 1-methoxy-2-propanol was put in a 1,000-ml three-neck flask equipped with a condenser and a stirrer and was heated to 70° C. Under a nitrogen stream, a solution of 40.9 g of 2-allyloxyethyl methacrylate, 5.2 g of methacrylic acid and 0.746 g of V-65 (manufactured by Wako Pure Chemical Industries, Ltd.) in 200 ml of 1-methoxy-2-propanol was added dropwise thereto over 2.5 hours. The mixture was further allowed to react at 70° C. for two hours. The reaction mixture was filtered, washed and dried to obtain the polymer compound (3). The weight average molecular weight of the resulting polymer compound was measured by gel permeation chromatography (GPC) using polystyrene as a standard, and found to be 110,000.

SYNTHISIS EXAMPLE 4

Synthesis of Polymer Compound (4)

80 ml of methyl ethyl ketone was put in a 500-ml three-neck flask equipped with a condenser and a stirrer and was heated to 70° C. Under a nitrogen stream, a solution of 12.5 g of methacrylic acid chloride, 5.2 g of methacrylic acid, 12.0 g of methyl methacrylate and 0.700 g of V-65 (manufactured by Wako Pure Chemical Industries, Ltd.) in 80 ml of methyl ethyl ketone was added dropwise thereto over 2.5 hours. The mixture was further allowed to react at 70° C. for two hours. After the reaction mixture was cooled to 0° C., 12.5 g of 2-allyloxyethyl alcohol was added dropwise while stirring, and the mixture was allowed to react for 12 hours with the temperature being gradually increased to room temperature. The reaction mixture was put in 3 L of water to deposit a polymer. The polymer was filtered, washed and dried to obtain the polymer compound (4). It was confirmed by NMR spectrum that allyl groups were introduced to the side chain by a polymer reaction. The weight average molecular weight of the resulting polymer compound was measured by gel permeation chromatography (GPC) using polystyrene as a standard, and found to be 95,000.

SYNTHISIS EXAMPLE 5

Synthesis of Polymer Compound (5)

150 ml of 1-methoxy-2-propanol was put in a 500-ml three-neck flask equipped with a condenser and a stirrer and was heated to 70° C. Under a nitrogen stream, a solution of 26.9 g of vinyl methacrylate, 5.2 g of methacrylic acid and 0.780 g of V-65 (manufactured by Wako Pure Chemical Industries, Ltd.) in 150 ml of 1-methoxy-2-propanol was added dropwise thereto over 2.5 hours. The mixture was further allowed to react at 70° C. for two hours. The reaction mixture was filtered, washed and dried to obtain the polymer compound (5). The weight average molecular weight of the resulting polymer compound was measured by gel permeation chromatography (GPC) using polystyrene as a standard, and found to be 120,000.

SYNTHISIS EXAMPLE 6

Synthesis of Polymer Compound (6)

100 ml of methyl ethyl ketone was put in a 500-ml three-neck flask equipped with a condenser and a stirrer and was heated to 70° C. Under a nitrogen stream, a solution of 12.5 g of methacrylic acid chloride, 5.2 g of methacrylic acid, 12.0 g of methyl methacrylate and 0.700 g of V-65 (manufactured by Wako Pure Chemical Industries, Ltd.) in 100 ml of methyl ethyl ketone was added dropwise thereto over 2.5 hours. The mixture was further allowed to react at 70° C. for two hours. After the reaction mixture was cooled to 0° C., 11.0 g of 2-hydroxyethyl monovinyl ether was added dropwise while stirring, and the mixture was allowed to react for 12 hours with the temperature being gradually increased to room temperature. The reaction mixture was put in 3 L of water to deposit a polymer. The polymer was filtered, washed and dried to obtain the polymer compound (6). It was confirmed by NMR spectrum that vinyl groups were introduced to the side chain by a polymer reaction. The weight average molecular weight of the resulting polymer compound was measured by gel permeation chromatography (GPC) using polystyrene as a standard, and found to be 95,000.

SYNTHESIS EXAMPLES 7 TO 23

The following polymer compounds (7) to (23) were synthesized in the same manner as in the synthesis of Synthesis Examples 1 to 6 except that the species of the charged monomer and the compositional ratios were changed. The weight average molecular weights of the polymer compounds were measured in the same manner as in Synthesis Examples 1 to 6.

The particular alkali soluble resins (A) obtained in the foregoing synthesis methods are shown in the following Tables 1 to 5 in terms of the structures of the constitutional units and the polymerization ratios by mole along with the measured weight average molecular weights (Polymer Compounds (1) to (23).

TABLE 1

| Polymer compound | Composition of synthesized polymer compound (mol %) | Weight average molecular weight |
|---|---|---|
| 1 | 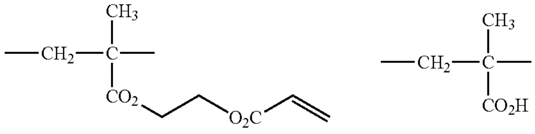 80 20 | 80,000 |
| 2 | 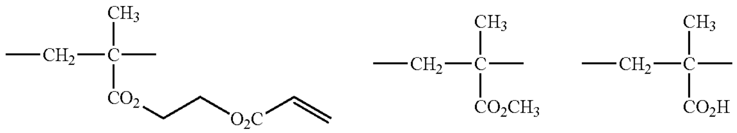 40 40 20 | 78,000 |
| 3 | 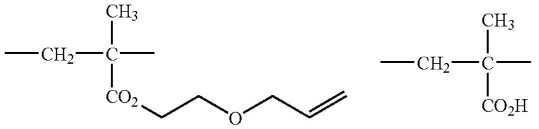 80 20 | 110,000 |
| 4 | 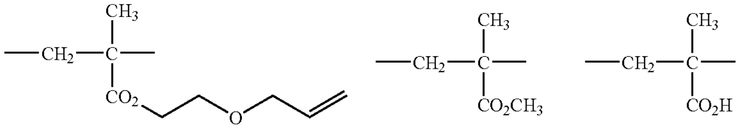 40 40 20 | 95,000 |
| 5 | 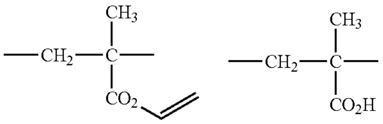 80 20 | 120,000 |

TABLE 2

| Polymer compound | Composition of synthesized polymer compound (mol %) | Weight average molecular weight |
|---|---|---|
| 6 | 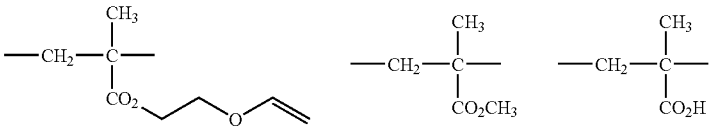 40 40 20 | 95,000 |

TABLE 2-continued
| Polymer compound | Composition of synthesized polymer compound (mol %) | Weight average molecular weight |
|---|---|---|
| 7 | 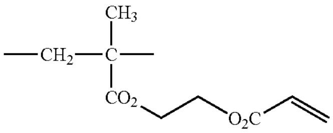 40 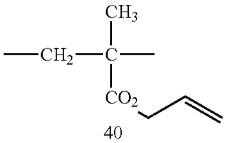 40 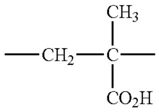 20 | 100,000 |
| 8 | 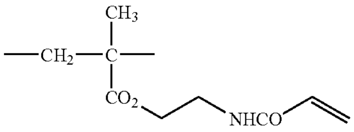 83 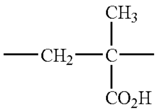 17 | 89,000 |
| 9 | 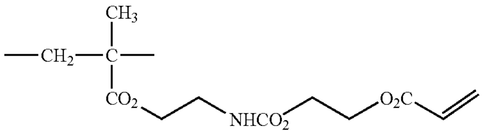 78 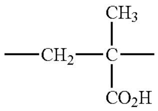 22 | 93,000 |
| 10 | 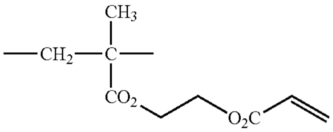 40 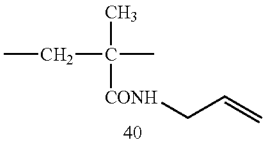 40 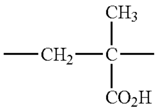 20 | 94,000 |
TABLE 3
| Polymer compound | Composition of synthesized polymer compound (mol %) | Weight average molecular weight |
|---|---|---|
| 11 | 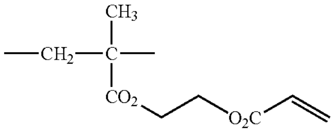 63 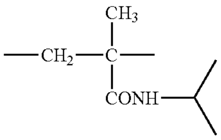 20 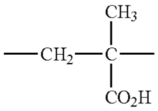 17 | 124,000 |
| 12 | 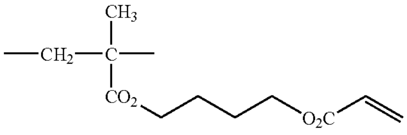 78 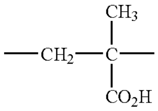 22 | 103,000 |
| 13 | 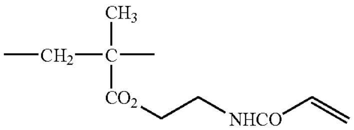 60 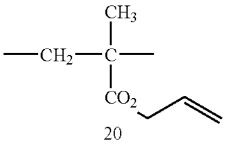 20 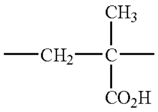 20 | 104,000 |

TABLE 3-continued
| Polymer compound | Composition of synthesized polymer compound (mol %) | Weight average molecular weight |
|---|---|---|
| 14 | 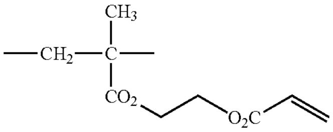 56 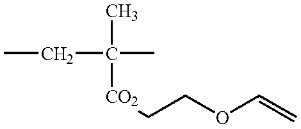 20 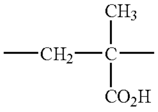 24 | 132,000 |
| 15 | 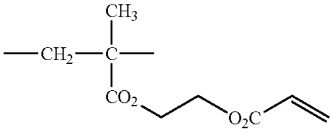 62 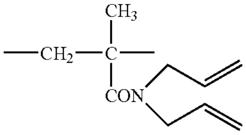 20 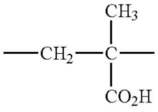 18 | 120,000 |
TABLE 4
| Polymer compound | Composition of synthesized polymer compound (mol %) | Weight average molecular weight |
|---|---|---|
| 16 | 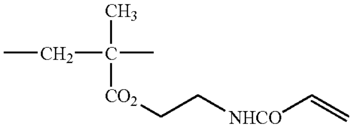 60 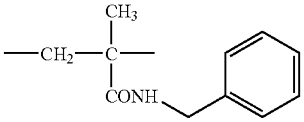 20 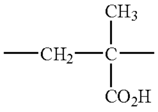 20 | 135,000 |
| 17 | 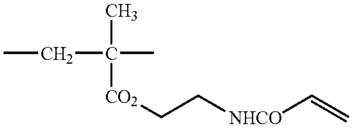 60 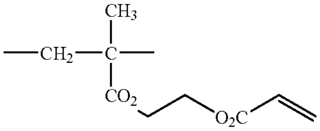 20 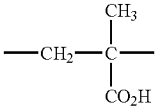 20 | 117,000 |
| 18 | 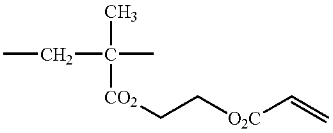 62 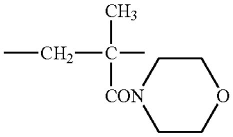 20 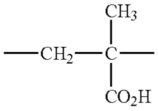 18 | 116,000 |
| 19 | 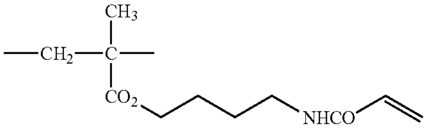 40 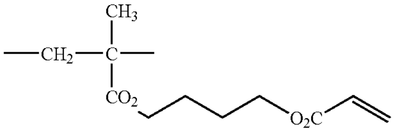 40 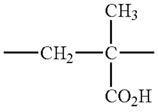 20 | 98,000 |
| 20 | 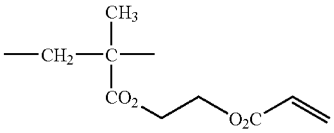 70 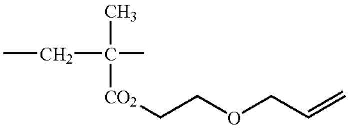 10 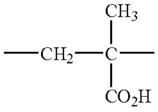 20 | 106,000 |

TABLE 5

| Polymer compound | Composition of synthesized polymer compound (mol %) | | | Weight average molecular weight |
|---|---|---|---|---|
| 21 | 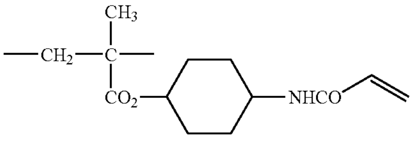 80 | 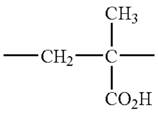 20 | | 97,000 |
| 22 | 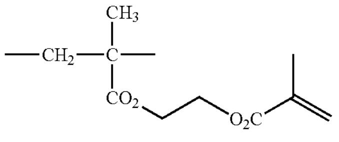 83 | 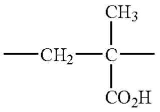 17 | | 114,000 |
| 23 | 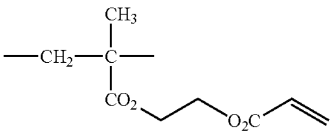 68 | 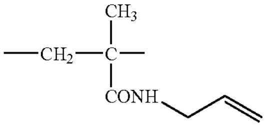 20 | 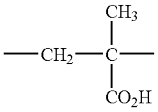 17 | 128,000 |

In another preferable embodiment, the particular alkali soluble resin of the invention is formed by copolymerizing another radical polymerizable compound in addition to the foregoing radical polymerizable compound in order to improve various performances, such as the image strength, as long as the effect of the invention is not impaired.

Examples of the radical polymerizable compound that can be copolymerized in the particular alkali soluble resin in the invention include radical polymerizable compounds selected from an acrylate, a methacrylate, an N,N-disubstituted acrylamide, an N,N-disubstituted methacrylamide, a styrene, an acrylonitrile a methacrylonitrile and the like.

Specific examples thereof include an acrylate, such as an alkyl acrylate (the alkyl group of which preferably has from 1 to 20 carbon atoms) (such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate), and an aryl acrylate (such as phenyl acrylate); an methacrylate, such as an alkyl methacrylate (the alkyl group of which preferably has from 1 to 20 carbon atoms) (such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate), and an aryl methacrylate (such as phenyl methacrylate, cresyl methacrylate and naphthyl methacrylate); a styrene, such as styrene, an alkylstyrene (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyerene, trifluoromethylstyrene, ethoxymethylstyrene and acetoxymethylstyrene), an alkoxystyrene (such as methoxystyrene, 4-methoxy-3-methylstyrene and dimethoxystyrene), and a halogenated styrene (such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene); acrylonitrile; and methacrylonitrile.

Among these radical polymerizable compounds, an acrylate, a methacrylate and a styrene are preferably used.

These radical polymerizable compounds may be used singly or in combination of two or more, and the preferable content of the copolymerizable components is from 0 to 95 mol %, and more preferably from 20 to 90 mol %.

In the particular alkali soluble resin (A) of the invention, a radical polymerizable compound having an acid group may be copolymerized to improve various performances, such as the removing property of the non-image part. Examples of the acid group contained in the radical copolymerizable compound include a carboxylic acid group, a sulfonic acid group and a phosphoric acid group, and a carboxylic acid group is particularly preferable. Examples of the radical polymerizable compound having a carboxylic acid group include acrylic acid, methacrylic acid, itaconic acid, crotonic acid, incrotonic acid, maleic acid and p-carboxylstyrene, and acrylic acid, methacrylic acid and p-carboxylstyrene are particularly preferable.

These radical polymerizable compounds may be used singly or in combination of two or more, and the preferable content of the copolymerizable components is from 0.5 to 2.0 meq/g, and particularly preferably from 0.8 to 1.6 meq/g, in terms of acid value.

The particular alkali soluble resin of the invention may be either a homopolymer or copolymers of a combination of different radical polymerizable compounds having groups represented by the general formulae (1) to (3), or a combination of at least one of the radical polymerizable compounds having groups represented by the general formulae (1) to (3) and another radical polymerizable compound described in the foregoing. The structure of the copolymer may be either a block copolymer, a random copolymer or a graft copolymer.

Examples of a solvent used when synthesizing the polymer compound include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate and ethyl lactate.

These solvents may be used singly or in combination of two or more.

The polymer component (component (A)) in the invention preferably has a weight average molecular weight of 30,000 or more, and more preferably in a range of from 80,000 to 180,000.

The particular alkali soluble resin (A) may contain an unallowed to react monomer. In this case, the proportion of the unallowed to react monomer is preferably 15% by weight or less based on the polymer compound.

The content of the particular alkali soluble resin (A) in the image recording material of the invention is generally about from 5 to 95% by weight, and preferably about from 10 to 85% by weight. In the case where the content is less than about 5% by weight, the strength of the image part may be insufficient upon image formation. In the case where the content exceeds about 95%, an image will not be formed.

(C) Onium Salt Compound

The onium salt compound forming radicals by heat mode exposure with light that is capable of being absorbed by the photothermal conversion agent (B) will be described below.

The onium salt compound forming radicals by heat mode exposure (hereinafter sometimes referred to as a radical initiator) is used in combination of the photothermal conversion agent (B) and forms radicals by energy of light capable of being absorbed by the photothermal conversion agent, for example by energy of light, heat or both upon irradiation with infrared laser, so as to initiate and accelerate polymerization of the particular alkali soluble resin (A) having a polymerizable functional group and, according to need, an other radical polymerizable compound (D). The term "heat mode exposure" used herein complies with the forgoing definition in the invention.

The radical initiator may be selected from known photopolymerization initiators and thermal polymerization initiators and used, but an onium salt compound is selected and used in the invention since it has high sensitivity.

The onium salt that is preferably used as the radical initiator in the invention will be described below. Preferable examples of the onium salt include an iodonium salt, a diazonium salt and a sulfonium salt. In the invention, these onium salts function as an initiator of radical polymerization rather than an acid generator. Preferable examples of the onium salt that is preferably used in the invention include onium salts represented by the following general formulae (10) to (12).

General formula (10)

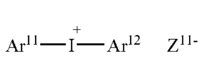

-continued

General formula (11)

General formula (12)

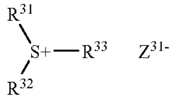

In the general formula (10), $Ar^{11}$ and $Ar^{12}$ each independently represents an aryl group having from 20 or less carbon atoms, which may have a substituent. Preferable examples of the substituent contained in the aryl group include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from a halide ion, a perchlorate ion, a tetrafluoroborate ion, hexafluorophosphate ion and sulfonate ion, and preferably a perchlorate ion, a hexafluorophosphate ion and an arylsulfonate ion.

In the general formula (11), $Ar^{21}$ represents an aryl group having from 20 or less carbon atoms, which may have a substituent. Preferable examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having from 12 or less carbon atoms and diarylamino group having 12 or less carbon atoms. $Z^{21-}$-represents the same counter ion as $Z^{11-}$.

In the general formula (12), $R^{31}$, $R^{32}$ and $R^{33}$ may be the same or different from each other and each represents a hydrocarbon group having 20 or less carbon atoms, which may have a substituent. Preferable examples of the substituent include a halogen atom, a nitro group, an alkyl group having 12 or less carbon atoms, an alkoxy group having 12 or less carbon atoms and an aryl group having 12 or less carbon atoms. $Z^{31-}$ represents the same counter ion as $Z^{11-}$.

Specific examples of an onium salt that can be preferably used in the invention as a radical initiator include those described in the paragraphs Nos. (0030) to (0033) in Japanese Patent Application No. 11-310623.

Furthermore, known polymerization initiators, such as the onium salts represented by the general formulae (I) to (IV) described in the paragraphs Nos. (0012) to (0050) in JP-A-9-34110 and the thermal polymerization initiators described in the paragraph No. (0016) in JP-A-8-108621, can also be preferably used in the invention.

The radical initiator used in the invention preferably has a maximum absorption wavelength of 400 nm or less, and more preferably 360 nm or less. When the radical initiator thus has an absorption wavelength in the ultraviolet region, the image recording material can be handled under white light.

The negative image recording material of another aspect of the invention comprises (A') a polymer compound that is insoluble in water but is soluble in an alkali aqueous solution and has at least one of structural units represented by the general formulae (4) and (5) in an amount of 30 mol % or more; (B) a photothermal conversion agent; and (C') a compound forming radicals by heat mode exposure with light that is capable of being absorbed by the photothermal conversion agent (B), and is capable of recording an image by heat mode exposure. The compounds that can be used in the image recording material of the invention will be respectively described below.

(A') Alkali Soluble Resin

The polymer compound that is insoluble in water but is soluble in an alkali aqueous solution and has at least one of structural units represented by the general formulae (4) and (5) in an amount of 30 mol % or more (hereinafter sometimes referred to as a particular alkali soluble resin) will be described.

The polymer compound used as a binder component of the image recording material of the invention is a polymer compound that is insoluble in water but is soluble in an alkali aqueous solution and has at least one of structural units represented by the general formulae (4) and (5) in an amount of 30 mol % or more. It is sufficient that the particular alkali soluble resin contains at least one kind of the structural units represented by the general formula (4) and (5), and it may contain both kinds thereof.

General formula (4)

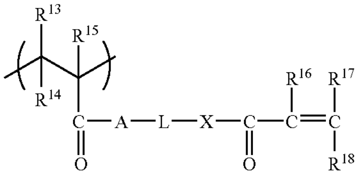

In the general formula (4), $R^{13}$ to $R^{15}$ each independently represents a monovalent organic group. Examples of $R^{13}$ to $R^{15}$ include a hydrogen atom and an alkyl group, which may have a substituent. Among these, a hydrogen atom is preferable for $R^{13}$ and $R^{14}$, and a hydrogen atom and a methyl group are preferable for $R^{15}$.

$R^{16}$ to $R^{18}$ each independently represents a monovalent organic group. Examples of $R^{16}$ include a hydrogen atom and an alkyl group, which may have a substituent. Among these, a hydrogen atom, a methyl group and an ethyl group are preferable for $R^{16}$. Examples of $R^{17}$ and $R^{18}$ independently include a hydrogen atom, a halogen atom, an amino group, a dialkylamino group, a carboxyl group, an alkoxycarbonyl group, a sulfo group, a nitro group, a cyano group, an alkyl group, which may have a substituent, an aryl group, which may have a substituent, an alkoxy group, which may have a substituent, an aryloxy group, which may have a substituent, an alkylamino group, which may have a substituent, an arylamino group, which may have a substituent, an alkylsulfonyl group, which may have a substituent, and an arylsulfonyl group, which may have a substituent. Among these, a hydrogen atom, a carboxyl group, an alkoxycarbonyl group, an alkyl group, which may have a substituent, and an aryl group, which may have a substituent, are preferable. In particular, a methyl group is more preferable for $R^{16}$, and a hydrogen atom is preferable for $R^{17}$ and $R^{18}$, from the standpoint of stability and reactivity.

Examples of the substituent that can be introduced include a methoxycarbonyl group, an ethoxycarbonyl group, an isopropyloxycarbonyl group, a methyl group, an ethyl group and a phenyl group.

A and X each independently represents an oxygen atom, a sulfur atom or —N($R^{25}$)—, wherein examples of $R^{25}$ include a hydrogen atom and an alkyl group, which may have a substituent.

L represents a divalent organic group, and an alkylene group, which may have a substituent, are preferable. More preferable examples thereof include an alkylene group having from 1 to 20 carbon atoms, which may have a substituent, a cycloalkylene group having from 3 to 20 carbon atoms, which may have a substituent, and an aromatic group having from 6 to 20 carbon atoms, which may have a substituent. Among these, a linear or branched alkylene group having from 1 to 10 carbon atoms, which may have a substituent, a cycloalkylene group having from 3 to 10 carbon atoms, which may have a substituent, and an aromatic group having from 6 to 12 carbon atoms, which may have a substituent, are preferable from the standpoint of strength and developing property.

General formula (5)

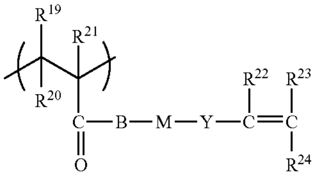

In the general formula (5), $R^{19}$ to $R^{21}$ each independently represents a monovalent organic group, and examples of which include a hydrogen atom and an alkyl group, which may have a substituent. Among these, a hydrogen atom is preferable for $R^{19}$ and $R^{20}$, and a hydrogen atom and a methyl group are preferable for $R^{21}$.

$R^{22}$ to $R^{24}$ each independently represents a monovalent organic group. Specific examples of the organic group include a halogen atom, an amino group, a dialkylamino group, a carboxyl group, an alkoxycarbonyl group, a sulfo group, a nitro group, a cyano group, an alkyl group, which may have a substituent, an aryl group, which may have a substituent, an alkoxy group, which may have a substituent, an aryloxy group, which may have a substituent, an alkylamino group, which may have a substituent, an arylamino group, which may have a substituent, an alkylsulfonyl group, which may have a substituent, and an arylsulfonyl group, which may have a substituent. Among these, a hydrogen atom, a carboxyl group, an alkoxycarbonyl group, an alkyl group, which may have a substituent, and an aryl group, which may have a substituent, are preferable.

Examples of the substituent which can be introduced include those given as examples in the general formula (4).

B represents an oxygen atom, a sulfur atom or —N($R^{25}$)—, and examples $R^{25}$ include a hydrogen atom and an alkyl group, which may have a substituent.

M represents a divalent organic group, and an alkylene group, which may have a substituent, are preferable. More preferable examples thereof include an alkylene group having from 1 to 20 carbon atoms, which may have a substituent, a cycloalkylene group having from 3 to 20 carbon atoms, which may have a substituent, and an aromatic group having from 6 to 20 carbon atoms, which may have a substituent. Among these, a linear or branched alkylene group having from 1 to 10 carbon atoms, which may have a substituent, a cycloalkylene group having from 3 to 10 carbon atoms, which may have a substituent, and an aromatic group having from 6 to 12 carbon atoms, which may have a substituent, are preferable from the standpoint of strength and developing property.

Y represents an oxygen atom, a sulfur atom, —N($R^{26}$)— or a phenylene group, and examples of $R^{26}$ include a hydrogen atom and an alkyl group, which may have a substituent. In particular, a phenylene group is preferable for Y from the standpoint of stability and reactivity.

Examples of the polymer skeleton structure of the particular alkali soluble resin (A), which is an essential component of the heat mode type negative image recording material of the invention, include a poly(meth)acrylate resin, a polyurethane resin, an acetal modified polyvinyl alcohol resin and a polyimide resin, and among these, a poly(meth) acrylate resin is preferable.

The particular alkali soluble resin (A), which is an essential component of the heat mode type negative image recording material of the invention, can be manufactured by at least one of the following synthesis methods (1) to (3).

Synthesis Method (1)

One or more kinds of a radical polymerizable compound represented by the following general formula (13) is copolymerized, or alternatively, 30 mol % or more of one or more kinds of a radical polymerizable compound represented by the following general formula (13) and another radical polymerizable compound, i.e., one not having a structural unit that is contained in the radical copolymerizable compound represented by the general formula (13), are copolymerized in an ordinary radical polymerization process, so as to synthesize a precursor of the desired polymer compound, and then the proton is abstracted to release Z by using a base, so as to obtain the desired polymer compound.

At this time, the production of the precursor of the polymer compound can be carried out by a known process, such as a suspension polymerization process or a solution polymerization process. The structure of the copolymer may be either a block copolymer, a random copolymer or a graft copolymer.

General formula (13)

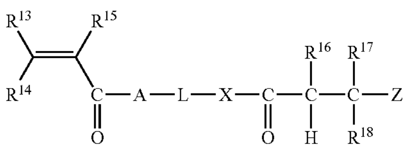

wherein Z represents an anionic releasing group, preferable examples of which include a halogen atom and a sulfonate group.

Examples of the base include both an inorganic compound and an organic compound. Preferable examples of the inorganic base include sodium hydroxide, potassium hydroxide, sodium carbonate, sodium bicarbonate, potassium carbonate and potassium bicarbonate. Examples of the organic base include a metallic alkoxide, such as sodium methoxide, sodium ethoxide and potassium t-butoxide, and an organic amine compound, such as triethylamine, pyridine and diisopropylethylamine.

Examples of the radical polymerizable compound represented by the general formula (13) include the following compounds, but it is not limited thereto.

(A-1)

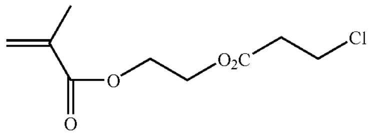

-continued (A-2)

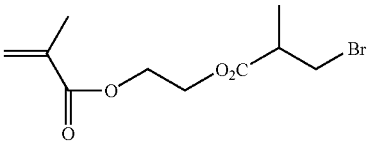

(A-3)

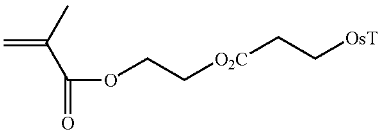

(A-4)

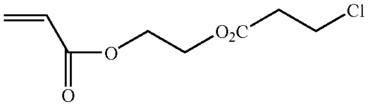

(A-5)

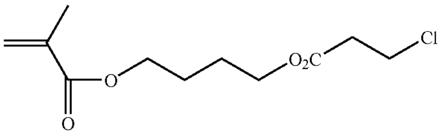

(A-6)

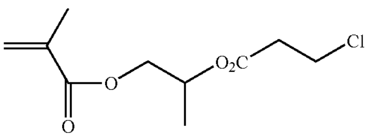

(A-7)

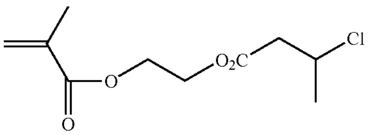

(A-8)

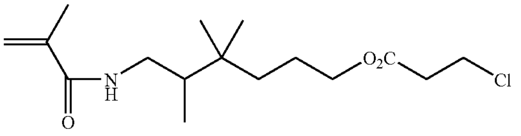

(A-9)

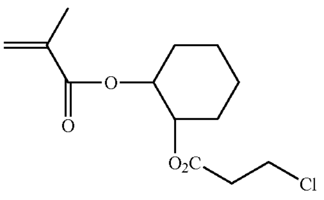

(A-10)

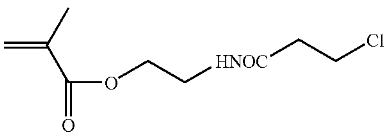

(A-11)

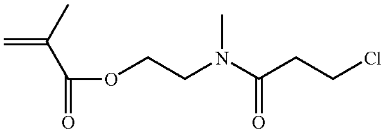

-continued (A-12)

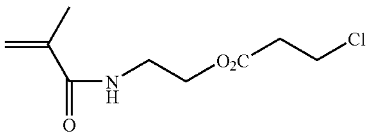

(A-13)

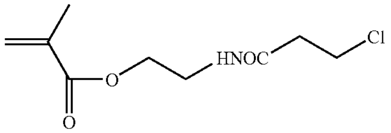

(A-14)

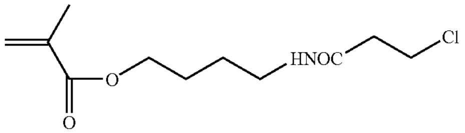

(A-15)

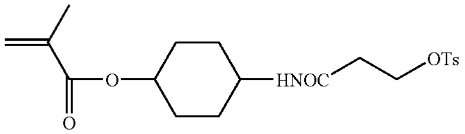

(A-16)

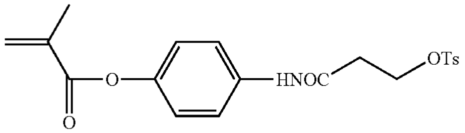

(A-17)

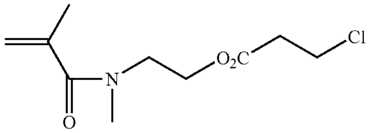

(A-18)

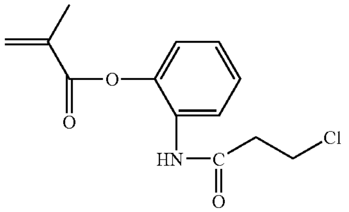

(A-19)

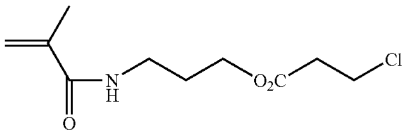

(A-20)

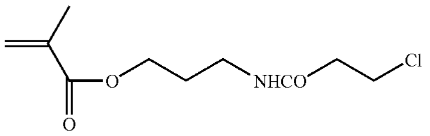

These radical polymerizable compounds are available as a commercial product or can be manufactured by the synthesis method described in Japanese Patent Application No. 2000-249569.

Synthesis Method (2)

One or more kinds of a radical polymerizable compound having a functional group, which will be described in detail later, is copolymerized, or alternatively, 30 mol % or more of one or more kinds of a radical polymerizable compound having the functional group and another radical polymerizable compound, i.e., one having no such functional group, are copolymerized in an ordinary radical polymerization process, so as to synthesize a backbone polymer compound, and then the side chain functional group and a compound represented by the following general formula (14) or (15) are allowed to react to obtain the desired polymer compound.

General formula (14)

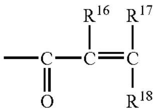

General formula (15)

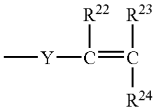

The production of the backbone polymer compound can be carried out by a known process, such as a suspension polymerization process or a solution polymerization process. The structure of the copolymer may be either a block copolymer, a random copolymer or a graft copolymer.

Examples of the functional group of the radical polymerizable compound having a functional group include a hydroxyl group, a carboxyl group, a carboxylic acid halide group, a carboxylic acid anhydride group, an amino group, a halogenated alkyl group, an isocyanate group and an epoxy group. Examples of the radical polymerizable compound having the functional group include 2-hydroxyethyl acrylate, 2-hydroxyethyl methacrylate, 4-hydroxybutyl acrylate, 4-hydroxybutyl methacrylate, acrylic acid, methacrylic acid, acrylic acid chloride, methacrylic acid chloride, N,N-dimethyl-2-aminoethyl methacrylate, 2-chloroethyl methacrylate, 2-ethyl isocyanate methacrylate, 3-propyl isocyanate methacrylate, glycidyl acrylate, glycidyl methacrylate, 3,4-epoxycyclohexylmethyl acrylate, 3,4-epoxycyclohexylmethyl methacrylate, 2-bromoethyl methacrylate, 3-bromopropyl methacrylate, 2-hydroxyethyl methacrylamide, 4-hydroxybutyl methacrylamide and itaconic acid.

Examples of the low molecular weight compound having a group represented by the general formula (14) include those given as examples in the radical polymerizable compound having a functional group. Examples of the low molecular weight compound having a group represented by the general formula (15) include ethylene glycol monovinyl ether, propylene glycol monovinyl ether, butylene glycol monovinyl ether, diethylene glycol monovinyl ether, 1-chloroethyl vinyl ether, 1-aminoethyl vinyl ether, 4-chloromethylstyrene and p-styrene carboxylic acid.

Synthesis Method (3)

One or more kinds of a radical polymerizable compound having both the unsaturated group represented by the general formula (15) and an ethylenic unsaturated group having higher addition polymerizability than the unsaturated group is copolymerized, or alternatively, 30 mol % or more of one or more kinds of a radical polymerizable compound having both the unsaturated group represented by the general formula (15) and an ethylenic unsaturated group having higher addition polymerizability than the unsaturated group and another radical polymerizable compound, i.e., one having no such group, are copolymerized in an ordinary radical polymerization process, so as to synthesize a polymer compound.

The production of the polymer compound can be carried out by a known process, such as a suspension polymerization process or a solution polymerization process. The structure of the copolymer may be either a block copolymer, a random copolymer or a graft copolymer.

Examples of the radical polymerizable compound having both the unsaturated group represented by the general formula (15) and an ethylenic unsaturated group having higher addition polymerizability than the unsaturated group include vinyl acrylate, vinyl methacrylate, 2-phenylvinyl acrylate, 2-phenylvinyl methacrylate, 1-propenyl acrylate, 1-propyenyl methacrylate, vinylacrylamide and vinylmethacrylamide.

The particular alkali soluble polymer can be obtained by carrying out one of these production methods (synthesis methods) or by carrying out a combination thereof.

Another preferable embodiment of the invention is one in which the particular alkali soluble resin of the invention is formed by copolymerizing another radical polymerizable compound in order to improve various performances, such as the image strength, in addition to the foregoing radical polymerizable compound having the particular functional group, as long as the effect of the invention is not impaired.

Examples of the radical polymerizable compound include radical polymerizable compounds selected from an acrylate, a methacrylate, an N,N-disubstituted acrylamide, an N,N-disubstituted methacrylamide, a styrene, an acrylonitrile and a methacrylonitrile.

Specific examples thereof include an acrylate, such as an alkyl acrylate (the alkyl group of which preferably has from 1 to 20 carbon atoms) (such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate), and an aryl acrylate (such as phenyl acrylate); an acrylate having a carbon-carbon unsaturated bond as a side chain substituent (such as allyl acrylate, 2-allyloxyethyl acrylate and propargyl acrylate); an methacrylate, such as an alkyl methacrylate (the alkyl group of which preferably has from 1 to 20 carbon atoms) (such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate), and an aryl methacrylate (such as phenyl methacrylate, cresyl methacrylate and naphthyl methacrylate); a methacrylate having a carbon-carbon unsaturated bond as a side chain substituent (such as allyl methacrylate, 2-allyloxyethyl methacrylate and propargyl methacrylate); a styrene, such as styrene, an alkylstyrene (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), an alkoxystyrene (such as methoxystyrene, 4-methoxy-3-methylstyrene and dimethoxystyrene), and a halogenated styrene (such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene); acrylonitrile; and methacrylonitrile.

Among these radical polymerizable compounds, an acrylate, a methacrylate and a styrene are preferably used, and an acrylate having a carbon-carbon unsaturated bond as a side chain substituent (such as allyl acrylate, 2-allyloxyethyl acrylate and propargyl acrylate) and a methacrylate having a carbon-carbon unsaturated bond as a side chain substituent (such as allyl methacrylate, 2-allyloxyethyl methacrylate and propargyl methacrylate) are preferably used.

These radical polymerizable compounds may be used singly or in combination of two or more, and the content of the copolymerizable components is preferably from 0 to 70 mol %. When the content exceeds 70 mol %, the strength of the hardened film may be insufficient.

In the particular alkali soluble resin of the invention, a radical polymerizable compound having an acid group may be copolymerized to improve various performances, such as the removing property of the non-image part. Examples of the acid group contained in the radical copolymerizable compound include a carboxylic acid group, a sulfonic acid group and a phosphoric acid group, and a carboxylic acid group is particularly preferable. Examples of the radical polymerizable compound having a carboxylic acid group include acrylic acid, methacrylic acid, itaconic acid, crotonic acid, incrotonic acid, maleic acid and p-carboxylstyrene, and acrylic acid, methacrylic acid and p-carboxylstyrene are particularly preferable.

These radical polymerizable compounds may be used singly or in combination of two or more, and the content of the copolymerizable components is preferably from 0.5 to 2.0 meq/g, and particularly preferably from 0.8 to 1.6 meq/g, in terms of acid value. When it exceeds 1.6 meq/g, image strength is likely to be reduced owing to an alkaline water phenomenon.

Examples of a solvent used when synthesizing the polymer compound include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate and ethyl lactate.

These solvents may be used singly or in combination of two or more.

The particular alkali soluble compound (A') of the invention preferably has a weight average molecular weight of 30,000 or more, and more preferably in a range of from 80,000 to 180,000. When it is less than 80,000, the strength of the hardened film tends to be insufficient, and when it exceeds 180,000, the developing property tends to be lowered.

The particular alkali soluble polymer (A') may contain an unallowed to react monomer. In this case, the proportion of the unallowed to react monomer is preferably 15% by weight or less based on the polymer compound.

The polymer compound of the invention may be used singly or in combination of two or more kinds thereof. Other polymer compounds not having a group represented by the general formula (4) or (5) may be mixed and used. In this case, the amount of the polymer compound not having a group represented by the general formula (4) or (5) is preferably 90% by weight or less, and more preferably 70% by weight or less, in the polymer compound.

The content of the particular alkali soluble resin (A') in the image recording material of the invention is generally about from 5 to 95% by weight, and preferably about from 40 to 90% by weight. In the case where the content is too small, there is a tendency that the strength of the recording layer may be insufficient to cause low printing durability, and when it is too large, it affects on the image formation property making deterioration of the image quality possible. Therefore, neither case is desirable.

SYNTHISIS EXAMPLE 24

Synthesis of Backbone Polymer Compound (24)

175 g of 1-methoxy-2-propanol was put in a 1,000-ml three-neck flask and was heated to 70° C. Under a nitrogen stream, a solution of 90.4 g of methacrylic acid, 51.3 g of ethyl methacrylate and 2.88 g of V-59 (manufactured by Wako Pure Chemical Industries, Ltd.) in 175 g of 1-methoxy-2-propanol was added dropwise thereto over 2.5 hours. The mixture was further allowed to react at 85° C. for two hours. After cooling the reaction mixture to room temperature, the reaction mixture was put in 3 L of water to deposit a polymer. The polymer was filtered, washed and dried to obtain 130 g of the backbone polymer compound (24). The weight average molecular weight of the backbone polymer compound was measured by gel permeation chromatography (GPC) using polystyrene as a standard, and found to be 70,000. The acid value measured by titration was 7.4 meq/g.

SYNTHISIS EXAMPLE 25

Synthesis of Polymer Compound (24)

20 g of the backbone polymer compound (24) and 1 g of p-methoxyphenol were put in a 1,000-ml three-neck flask equipped with a condenser, and dissolved in 150 g of dimethylsulfoxide. 22.8 g of 1,8-diazabicyclo[5.4.0]-7-undecene was added dropwise thereto by using a dropping funnel. After stirring for 30 minutes at room temperature, 14.8 g of 3-bromopropyl methacrylate was added dropwise thereto, followed by stirring at 60° C. for 8 hours. After cooling to room temperature, the reaction mixture was put in 3 L of water to deposit a polymer. The polymer was filtered, washed and dried to obtain 130 g of the polymer compound (24). The weight average molecular weight of the resulting polymer compound was measured by gel permeation chromatography (GPC) using polystyrene as a standard, and found to be 80,000. The acid value measured by titration was 1.3 meq/g. It was confirmed that the polymer compound had the structure shown in Table 6 below from the difference in acid value between the polymer compound (24) and the backbone polymer compound (24) and the results of H NMR.

SYNTHISIS EXAMPLE 26

Synthesis of Polymer Compound (25)

20 g of the backbone polymer compound (24) and 1 g of p-methoxyphenol were put in a 1,000-ml three-neck flask equipped with a condenser, and they were dissolved in 150 g of dimethylsulfoxide. 22.8 g of 1,8-diazabicyclo[5.4.0]-7-undecene was added dropwise thereto by using a dropping funnel. After stirring for 30 minutes at room temperature, 11.3 g of p-chloromethylstyrene was added dropwise thereto, followed by stirring at 60° C. for 8 hours. After cooling to room temperature, the reaction mixture was put in 3 L of water to deposit a polymer. The polymer was filtered, washed and dried to obtain 120 g of the polymer compound (25). The weight average molecular weight of the resulting polymer compound was measured by gel permeation chromatography (GPC) using polystyrene as a standard, and found to be 85,000. The acid value measured by titration was 1.3 meq/g. It was confirmed that the polymer compound had the structure shown in Table 6 below from the difference in acid value between the polymer compound (25) and the backbone polymer compound (24) and the results of H NMR.

SYNTHISIS EXAMPLE 27

Synthesis of Polymer Compound (26)

80 ml of 1-methoxy-2-propanol was put in a 500-ml three-neck flask equipped with a condenser and a stirrer and was heated to 70° C. Under a nitrogen stream, a solution of 44.1 g of the compound (M-1), 8.6 g of methacrylic acid, 22.8 g of ethyl methacrylate, and 0.746 g of V-65 (manufactured by Wako Pure Chemical Industries, Ltd.) in 80 ml of 1-methoxy-2-propanol was added dropwise thereto over 2.5 hours. The mixture was further allowed to react at 70° C. for two hours. After the reaction mixture was diluted with 100 ml of 1-methoxy-2-propanol and cooled to 0° C., 60.6 g of triethylamine was added dropwise while stirring, and the mixture was allowed to react for 12 hours with the temperature being gradually increased to room temperature. After cooling the reaction mixture to 0° C., a 5M HCl was added dropwise to the reaction mixture while stirring until the pH of the reaction mixture reached 6 or less. The reaction mixture was put in 3 L of water to deposit a polymer. The polymer was filtered, washed and dried to obtain the polymer compound (26). It was confirmed by NMR spectrum that all the group derived from the compound (M-1) were converted to acrylic groups. The weight average molecular weight of the resulting polymer compound was measured by gel permeation chromatography (GPC) using polystyrene as a standard, and found to be 80,000.

SYNTHESIS EXAMPLES 28 TO 34

The following polymer compounds (27) to (33) were synthesized in the same manner as in the synthesis of Synthesis Examples 24 to 26 except that the monomer and the compositional ratios were changed. The weight average molecular weights of the polymer compounds were measured in the same manner as in Synthesis Examples 24 to 26.

The particular alkali soluble resins (A) obtained in the foregoing synthesis methods are shown in the following Tables 6 and 7 in terms of the structures of the constitutional units and the polymerization ratios by mole along with the measured weight average molecular weights (Polymer Compounds (24) to (33)).

TABLE 6
| Polymer compound | Composition of synthesized polymer compound (mol %) | Weight average molecular weight |
|---|---|---|
| 24 | 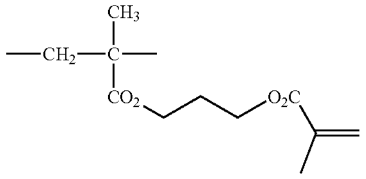 50 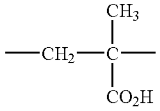 20 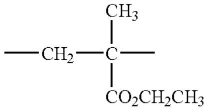 30 | 80,000 |
| 25 | 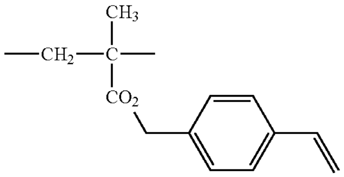 50 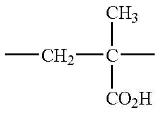 20 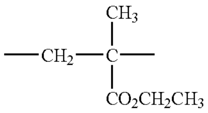 30 | 85,000 |
| 26 | 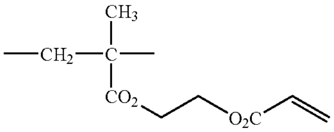 40 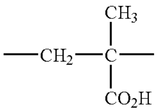 20 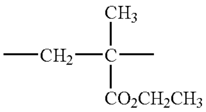 40 | 80,000 |
| 27 | 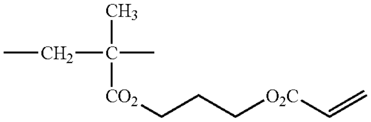 50 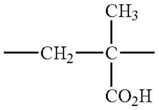 20 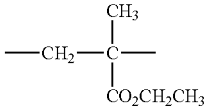 30 | 97,000 |
| 28 | 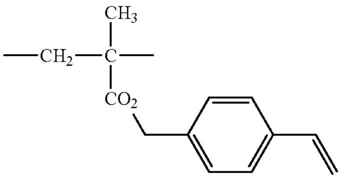 20 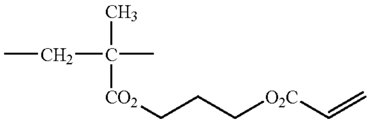 20 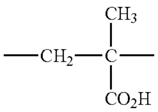 20 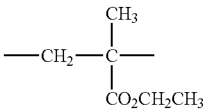 40 | 105,000 |

TABLE 7

| Polymer compound | Composition of synthesized polymer compound (mol %) | Weight average molecular weight |
|---|---|---|
| 29 | 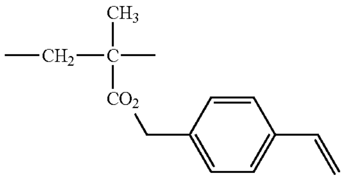 30 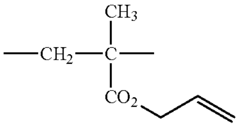 50 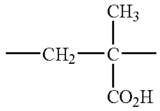 20 | 98,000 |
| 30 | 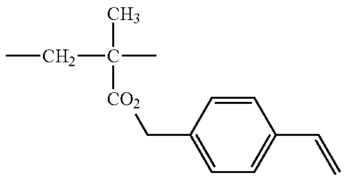 40 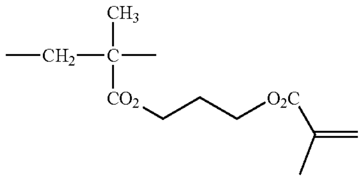 40 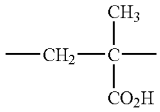 20 | 79,000 |
| 31 | 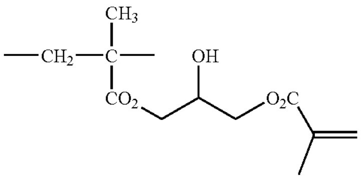 50 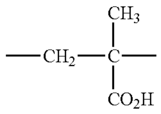 20 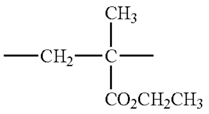 30 | 82,000 |
| 32 | 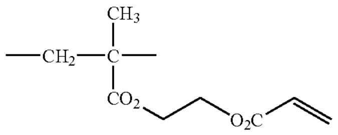 70 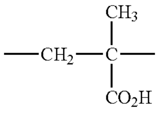 20 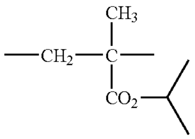 10 | 65,000 |
| 33 | 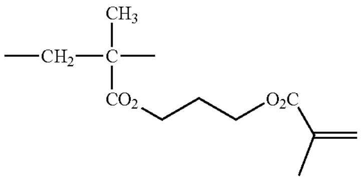 80 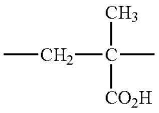 15 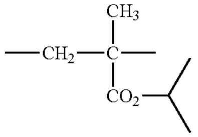 5 | 55,000 |

(B) Photothermal Conversion Agent

A photothermal conversion agent is necessary in the image recording material of the invention because it carries out recording through heat mode exposure, representative examples of which include exposure with a laser emitting an infrared ray. The photothermal conversion agent functions to absorb light of a prescribed wavelength and converts the light to heat. At this time, the component (C), i.e., the compound forming radicals by heat mode exposure with light that is capable of being absorbed by the photothermal conversion agent (B), is decomposed by the heat thus formed, so as to generate radicals. It is sufficient that the photothermal conversion agent used in the invention has such a function that absorbed light is converted to heat. In general, examples thereof include dyes and pigments that are referred to as a so-called infrared ray absorbent, which has the absorption maximum at a wavelength of an infrared laser used for recording, i.e., a wavelength of from 760 to 1,200 nm.

As the dye, known products can be utilized, for example, the commercially available dyes and the dyes described in literature, such as *Senryo Binran (Dye Handbook), edited by The Society of Synthetic Organic Chemistry, Japan,* 1970. Specific examples thereof include an azo dye, a metallic complex azo dye, a pyrazolone azo dye, a napththoquinone dye, an anthraquinone dye, a phthalocyanine dye, a carbonium dye, a quinonimine dye, a methine dye, a cyanine dye, a squarylium dye, a pyrylium salt and a metallic thiolate complex.

Preferable examples of the dye include the cyanine dyes described in JP-A-58-125246, JP-A-59-84356, JP-A-59-202829 and JP-A-60-78787, the methine dyes described in JP-A-58-173696, JP-A-58-181690 and JP-A-58-194595, the naphthoquinone dyes described in JP-A-58-112793, JP-A-58,224793, JP-A-59-48187, JP-A-59-73996, JP-A-60-52940 and JP-A-60-63744, the squarylium dyes described in JP-A-58-112792, and the cyanine dyes described in British Patent No. 434,875.

The infrared absorbing sensitizers described in U.S. Pat. No. 5,156,938 are also preferably used. The substituted arylbenzo(thio)pyrylium salts described in U.S. Pat. No. 3,881,924, the trimethinethiapyrylium salts described in JP-A-57-142645 (U.S. Pat. No. 4,327,169), the pyrylium series compounds described in JP-A-58-181051, JP-A-58-220,143, JP-A-59-41363, JP-A-59-84248, JP-A-59-84249, JP-A-59-146063 and JP-A-59-146061, the cyanine dyes described in JP-A-59-216146, the pentamethinethiopyrylium salts described in U.S. Pat. No. 4,283,475, and the pyrylium compounds described in JP-B-5-13514 and JP-B-5-19702 are also preferably used.

Other preferable examples of the dye include the infrared absorbing dyes of formulae (I) and (II) in U.S. Pat. No. 4,756,993.

Among these dyes, a cyanine dye, a squarylium dye, a pyrylium salt and a nickel thiolate complex are particularly preferable. Furthermore, a cyanine dye is preferable, and a cyanine dye represented by the following general formula (I) is especially preferable:

General formula (I)

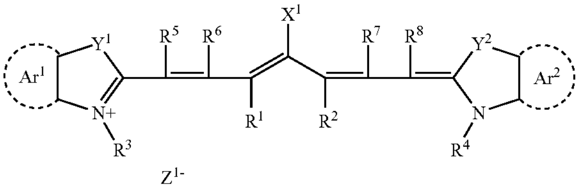

In the general formula (I), $X^1$ represents a halogen atom or $X^2$—$L^1$, wherein $X^2$ represents an oxygen atom or a sulfur atom, and $L^1$ represents a hydrocarbon group having from 1 to 12 carbon atoms. $R^1$ and $R^2$ each independently represents a hydrocarbon group having from 1 to 12 carbon atoms. From the standpoint of the storage stability of the coating composition for the photosensitive layer, it is preferable that $R^1$ and $R^2$ each independently represents a hydrocarbon group having 2 or more carbon atoms, and it is particularly preferable that $R^1$ and $R^2$ are bonded to each other to form a 5-membered ring or a 6-membered ring.

$Ar^1$ and $Ar^2$, which may be the same or different, each represents an aromatic hydrocarbon group, which may have a substituent. Preferable examples of the aromatic hydrocarbon group include a benzene ring and a naphthalene ring. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, and is preferably a hydrogen atom from the standpoint of the availability of the raw materials.

$Z^{1-}$ represents a counter anion. In the case where a sulfo group is substituted on one of $R^1$ to $R^8$, the counter anion represented by $Z^{1-}$ is unnecessary. Preferable examples of the counter anion represented by $Z^{1-}$ include a halogenide ion, a perchlorate ion, a tetrafluoroborate ion, hexafluorophosphate ion and sulfonate ion, and preferably a perchlorate ion, a hexafluorophosphate ion and an arylsulfonate ion.

Specific examples of the cyanine dye represented by the general formula (I), which is preferably used in the invention, include those described in the paragraphs Nos. (0017) to (0019) of Japanese Patent Application No. 11-310623.

Examples of the pigment that is used in the invention include the commercially available pigments and the pigments described in Color Index Handbook (C.I.), *Saishin Ganryo Binran* (Newest Pigment Handbook) (edited by Society of Pigment Technologies, Japan, 1977), *Saishin Ganryo Ouyou Gijutu* (Newest Pigment Application Technologies) (published by CMC Press, 1986 and *Insatsu Ink Gijutu* (Printing Ink Technologies) (published by CMC Press, 1984).

Examples of species of the pigment include a black pigment, a yellow pigment, an orange pigment, a brown pigment, a red pigment, a violet pigment, a blue pigment, a green pigment, a fluorescent pigment, a metallic powder pigment and a polymer bound dye. Specific examples thereof include an insoluble azo pigment, an azo lake pigment, a condensed azo pigment, a chelate azo pigment, a phthalocyanine pigment, an anthraquinone pigment, perylene and perynone pigments, a thioindigo pigment, a quinacridone pigment, a dioxadine pigment, an isoindrinone pigment, a quinophthalone pigment, a dyeing lake pigment, an azine pigment, a nitroso pigment, a nitro pigment, a natural pigment, a fluorescent pigment, an inorganic pigment and carbon black. Among these pigment, carbon black is preferable.

The pigment may be used without being subjected to a surface treatment or may be used after being subjected to a surface treatment. Examples of the method for the surface treatment include coating a resin or wax on the surface, attaching a surface active agent, and bonding a reactive substance (such as a silane coupling agent, an epoxy compound and a polyisocyanate) to the surface of the pigment. These methods for the surface treatment are described in *Kinzoku Sekken no Seishitu to Ouyou* (Nature and Applications of Metallic Soap) (published by Saiwai Shobo, Inc.), *Insatsu Ink Gijutu* (Printing Ink Technologies) (published by CMC Press, 1984), and *Saishin Ganryo Ouyou Gijutu* (Newest Pigment Application Technologies) (published by CMC Press, 1986).

The pigment preferably has a particle diameter in a range of from 0.01 to 10 μm, more preferably in a range of from 0.05 to 1 μm, and particularly preferably in a range of from 0.1 to 1 μm. A particle diameter of the pigment of less than 0.01 μm is not preferable from the standpoint of the stability of the dispersion in the coating composition for the image photosensitive layer, and a particle diameter exceeding 10 μm is not preferable from the standpoint of the uniformity of the image photosensitive layer.

As the method for dispersing the pigment, a known dispersion techniques used for the production of inks and toners can be used. Examples of the dispersing apparatus include an ultrasonic wave dispersing apparatus, a sand mill, an attritor, a pearl mill, a super mill, a ball mill, an impeller, a disperser, a KD mill, a colloid mill, a dynatron, a three-roll mill and a pressure kneader. The details thereof are described in *Saishin Ganryo Ouyou Gijutu* (Newest Pigment Application Technologies) (published by CMC Press, 1986).

The photothermal conversion agent may be added to the same layer as the other component, or alternatively, another layer may be provided, to which the photothermal conversion agent is added. It is preferable that when a negative image forming material is produced, the optical density of the photosensitive layer at the absorption maximum in a wavelength range of from 760 to 1,200 nm falls within a range of 0.1 to 3.0. In the case where the optical density is outside the range, there is a tendency for the sensitivity to be lowered. Since the optical density is determined by the addition amount of the photothermal conversion agent and the thickness of the recording layer, a prescribed optical density can be obtained by controlling these parameters. The optical density of the recording layer can be measured by an ordinary method. Examples of the measurement method include a method, in which a recording layer is formed on a transparent or white support in such an amount that is appropriately determined as the dry coating amount range required for a lithographic printing plate, and the optical density is measured by a transmission optical densitometer, and a method, in which a recording layer is formed on a reflective support, such as aluminum, and the reflection density is measured.

(C) Radical Initiator

The salt compound forming radicals by heat mode exposure with light that is capable of being absorbed by the photothermal conversion agent (B) will be described below.

The salt compound forming radicals by heat mode exposure (hereinafter sometimes referred to as a radical initiator) is used in combination with the photothermal conversion agent (B) and forms radicals by energy of light capable of being absorbed by the photothermal conversion agent, for example by energy of light, heat or both upon irradiation with infrared laser, so as to initiate and accelerate polymerization of the particular alkali soluble resin (A) and, according to need, the other radical polymerizable compound (D). The term "heat mode exposure" used herein obeys the forgoing definition in the invention.

The radical initiator may be selected from photopolymerization initiators and thermal polymerization initiators, and examples thereof include an onium salt, a triazine compound having a trihalomethyl group, a peroxide, an azo polymerization initiator, an azide compound and a quinoneazide, with an onium salt being preferable owing to the high sensitivity.

The onium salt that can be preferably used as the radical initiator in the invention, specifically, an iodonium salt, a diazonium salt and a sulfonium salt, will be described below. While the onium salt functions as an acid forming agent, when it is used in combination with a compound having radical polymerizability as in the invention, it functions as an initiator of radical polymerization. Preferable examples of the onium salt that is preferably used in the invention include onium salts represented by the following general formulae (10) to (12).

General formula (10)

$$Ar^{11}—\overset{+}{I}—Ar^{12} \quad Z^{11-}$$

General formula (11)

$$Ar^{21}—\overset{+}{N}\equiv N \quad Z^{21-}$$

-continued

General formula (12)

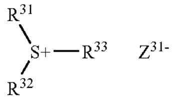

In the general formula (10), $Ar^{11}$ and $Ar^{12}$ each independently represents an aryl group having from 20 or less carbon atoms, which may have a substituent. Preferable examples of the substituent contained in the aryl group include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from a halide ion, a perchlorate ion, a carboxylate ion, a tetrafluoroborate ion, hexafluorophosphate ion and sulfonate ion, and preferably a perchlorate ion, a hexafluorophosphate ion and an arylsulfonate ion.

In the general formula (11), $Ar^{21}$ represents an aryl group having from 20 or less carbon atoms, which may have a substituent. Preferable examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having from 12 or less carbon atoms and diarylamino group having 12 or less carbon atoms. $Z^{21-}$ represents the same counter ion as $Z^{11-}$.

In the general formula (12), $R^{31}$, $R^{32}$ and $R^{33}$ may be the same or different from each other and each represents a hydrocarbon group having 20 or less carbon atoms, which may have a substituent. Preferable examples of the substituent include a halogen atom, a nitro group, an alkyl group having 12 or less carbon atoms, an alkoxy group having 12 or less carbon atoms and an aryl group having 12 or less carbon atoms. $Z^{31-}$ represents the same counter ion as $Z^{11-}$.

Specific examples of an onium salt that can be preferably used in the invention as a radical initiator include those described in the paragraphs Nos. (0030) to (0033) in Japanese Patent Application No. 11-310623 and those described in the paragraphs Nos. (0015) to (0046) in Japanese Patent Application No. 2000-160323.

The onium salt used in the invention preferably has a maximum absorption wavelength of 400 nm or less, and more preferably 360 nm or less. When the onium salt thus has an absorption wavelength in the ultraviolet region, the image recording material can be handled under white light.

The radical initiator can be added to the coating composition for the recording layer in a proportion of from 0.1 to 50% by weight, preferably from 0.5 to 30% by weight, and particularly preferably from 1 to 20% by weight. When the addition amount is less than 0.1% by weight, the sensitivity is lowered, and when it exceeds 50% by weight, staining of the non-image part may occur upon printing. The radical initiator may be used singly or in combination of two or more. The radical initiator may be added to the same layer as the other component, or alternatively, another layer may be provided, to which the radical initiator is added.

In the image recording material of the invention, another radical polymerizable compound (D) may be used in combination for improving the image strength according to need.

(D) Radical Polymerizable Compound

The radical polymerizable compound that can be used in combination in the image recording material of the invention is a radical polymerizable compound having at least one ethylenic unsaturated double bond, and is selected from compounds having at least one, preferably two or more, end ethylenic unsaturated bonds. Such a group of compounds has been well known in this field, and they may be used in the invention without any particular limitation. They have various chemical forms, such as a monomer, a dimer, a trimer, an oligomer, a mixture thereof and a copolymer thereof. Examples of the monomer and the copolymer thereof include an unsaturated carboxylic acid (such as acrylic acid, methacrylic acid, itaconic acid, crotonic acid, isocrotonic acid and maleic acid), and an ester and an amide thereof, and an ester of an unsaturated carboxylic acid and an aliphatic polyvalent alcohol compound and amide of an unsaturated carboxylic acid and an aliphatic polyvalent amine compound are preferably used. Examples thereof that are preferably used also include an unsaturated carboxylate having a nucleophilic group, such as a hydroxyl group, an amino group and a mercapto group, an addition reaction product of an amide with a monovalent or polyvalent isocyanate or epoxy, and a dehydration condensation reaction product of an amide with a monovalent or polyvalent carboxylic acid. Examples thereof that are preferably used further include an unsaturated carboxylate having an electrophilic group, such as an isocyanate group and an epoxy group, an addition reaction product of an amide with a monovalent or polyvalent alcohol, amine or thiol, an unsaturated carboxylate having a releasing substituent group, such as a halogen group and a tosyloxy group, and a substitution reaction product of an amide with a monovalent or polyvalent alcohol, amine or thiol. Other examples thereof that can be used include such compounds that are obtained by replacing the unsaturated carboxylic acid in the foregoing compounds by an unsaturated phosphoric acid or styrene.

Examples of the ester of an aliphatic polyvalent alcohol compound and an unsaturated carboxylic acid which is the radical polymerizable compound include the following. Examples of an acrylate include ethylene glycol diacrylate, triethylene glycol dacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, pentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and a polyester acrylate oligomer.

Examples of a methacrylate include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)phenyl)dimethylmethane and bis(p-(methacryloxyethoxy)phenyl) dimethylmethane;

Examples of an itaconate include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of a crotonate include ethylene glycol dicrotonate, tetramethylene glycol dicrotonate, pentaerythritol dicrotonate and sorbitol tetracrotonate.

Examples of an isocrotonate include ethylene glycol diisocrotonate, pentaerythritol diisocrotonate and sorbitol tetraisocrotonate.

Examples of a maleate include ethylene glycol dimaleate, tetraethylene glycol dimaleate, pentaerythritol dimaleate and sorbitol tetramaleate.

Examples of other esters include the aliphatic alcohol series esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of a monomer of an amide of an aliphatic polyvalent amine compound and an unsaturated carboxylic acid include methylenebis(acrylamide), methylenebis(methacrylamide), 1,6-hexamethylenebis(acrylamide), 1,6-hexamethylenebis(methacrylamide), diethylenetriamine trisacrylamide, xylylenebisacrylamide and xylylenebismethacrylamide.

Preferable examples of the amide series monomer include those having a cyclohexylene structure described in JP-B-54-21726.

A urethane addition polymerizable compound manufactured by using an addition reaction of an isocyanate and a hydroxyl group is also preferable. Specific examples thereof include a vinylurethane compound containing two or more polymerizable vinyl groups in one molecule, which is manufactured by adding a vinyl monomer containing a hydroxyl group represented by the following general formula (16) to a polyisocyanate compound having two or more isocyanate groups in one molecule described in JP-B-48-41708.

$$CH_2{=}C(R^{41})COOCH_2CH(R^{42})OH \qquad \text{General formula (16)}$$

wherein $R^{41}$ and $R^{42}$ each independently represents H or $CH_3$.

The urethane acrylate described in JP-A-51-37193, JP-B-2-32293 and JP-B-2-16765, and a urethane compound having an ethylene oxide skeleton described in JP-B-58-49860, JP-B-56-17654, JP-B-62-39417 and JP-B-62-39418 are preferably used.

Furthermore, the radical polymerizable compounds having an amino structure or a sulfide structure described in JP-A-63-277653, JP-A-63-260909 and JP-A-1-105238 may also be used.

Other examples include a polyester acrylate and a polyfunctional acrylate or methacrylate, such as an epoxyacrylate formed by reacting a polyester acrylate or an epoxy with (meth)acrylic acid described in JP-A-48-64183, JP-B-49-43191 and JP-B-52-30490. The particular unsaturated compounds described in JP-B-46-43946, JP-B-1-40337 and JP-B-1-40336, and the vinyl sulfonic acid compound described in JP-A-2-25493 may also be exemplified. Furthermore, in some cases, the structure containing a perfluoroalkyl group described in JP-A-61-22048 is preferably used. The compounds described as photocurable monomers and oligomers in Nippon *Secchaku Kyoukai Shi* (Journal of the Adhesion Society of Japan), vol. 20, No. 7, pp. 300 to 308 (1984) may also be used.

The radical polymerizable compound (D) may be used singly or in combination of two or more. Specific conditions for use, such as the structure of the compound, whether it is used singly or in combination, and the addition amount of the compound, can be freely determined corresponding to the intended design of the final recording material.

It is advantageous in view of sensitivity for the mixing ratio of the radical polymerizable compound in the image recording material to be large. However, when it is too large, undesirable phase separation occur, and a problem with the production process due to adhesiveness of the image recording layer (for example, transfer of the recording layer component and production failure due to the adhesiveness) and a problem of deposition from the developing solution may occur. In view of these circumstances, the mixing ratio of the radical polymerizable compound is, in many cases, generally from 5 to 80% by weight, and preferably from 20 to 75% by weight, based on the total amount of the composition.

The mixing ratio of the particular alkali soluble polymer (A) and the other radical polymerizable compound (D) in the invention is generally from 1/0.05 to 1/3 by weight, preferably from 1/0.1 to 1/2, and more preferably from 1/0.3 to 1/1.5.

In the method of using the radical polymerizable compound, the structure, the mixing ratios and the addition amounts may be arbitrarily selected from the standpoint of the extent of polymerization inhibition due to oxygen, the resolution, the fogging property, the change in refractive index and the surface adhesiveness. In some cases, such layer constitution and coating method as an undercoating and an overcoating can be practiced.

Other Components

The image recording material of the invention may further contain various compounds other than the foregoing. For example, a dye having large absorption in the visible ray region may be used as a coloring agent of an image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries, Ltd.), Victoria Pure Blue, Crystal Violet (C.I. 42555), Methyl Violet (C.I. 42535), Ethyl Violet, Rhodamine B (C.I. 145170B), Malachite Green (C.I. 42000) and Methylene Blue (C.I. 52015), as well as the dyes described in JP-A-62-293247. Pigments, such as a phthalocyanine pigment, an azo pigment, carbon black and titanium oxide, may also be preferably used.

The coloring agent is preferably added since the distinction between an image part and a non-image part becomes easy after formation of an image. The addition amount thereof is generally from 0.01 to 10% by weight based on the total solid content of the coating composition for the photosensitive layer.

It is preferable in the invention that a small amount of a thermal polymerization inhibitor is added to prevent unnecessary thermal polymerization of the radical polymerizable compound during preparation and storage of the image recording material. Examples of the suitable thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The addition amount of the thermal polymerization inhibitor is preferably about from 0.01 to 5% by weight based on the total weight of the composition. A higher fatty acid derivative, such as behenic acid and behenic amide, may be added so as to be localized on the surface of the photosensitive layer, according to need, in order to prevent polymerization inhibition due to oxygen. The addition amount of the higher fatty acid derivative is preferably about from 0.1 to 10% by weight based on the total composition.

The image recording material of the invention is mainly used for forming an image recording layer of a lithographic printing plate original. In order to enhance the stability of the image recording layer with respect to the developing conditions, an anionic surface active agent described in JP-A-62-251740 and JP-A-3-208514 and an amphoteric surface active agent described in JP-A-59-121044 and JP-A-4-13149 may be added.

Specific examples of the nonionic surface active agent include sorbitan tristearate, sorbitan monopalmitate, stearic acid monoglyceride and polyoxyethylene nonylphenyl ether.

Specific examples of the amphoteric surface active agent include alkyldi(aminoethyl)glycine, alkylpolyaminoethyiglycine hydrochloride, 2-alkyl-N-carboxyethyl-N-hydroxyethylimidazolinium betaine and N-tetradecyl-N,N-betaine (for example, Amogen K, a trade name, manufactured by Dai-ichi Kogyo Seiyaku Co., Ltd.).

The proportion of the nonionic surface active agent and the amphoteric surface active agent in the coating composition for the photosensitive layer is preferably from 0.05 to 15% by weight, and more preferably from 0.1 to 5% by weight.

Furthermore, a plasticizer for imparting flexibility to the coating film may be added, according to need, to the coating composition for the photosensitive layer of the invention. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate may be used.

In order to produce a lithographic printing plate original by using the image recording material of the invention, it is generally sufficient that constitutional component of the image recording material are dissolved in a solvent along with other components necessary for forming a coating composition, and the resulting composition is coated on an appropriate support. Examples of the solvent used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but it is not limited to these. The solvent may be used singly or as a mixture. The concentration of the foregoing component (all the solid components including the additives) in the solvent is preferably from 1 to 50% by weight.

The coating amount (solid component) of the image recording layer after coating and drying on the support is generally preferably from 0.5 to 5.0 $g/m^2$ for a lithographic printing plate original while it varies depending on purpose. Various methods may be used for coating. Examples thereof include bar coater coating, spin coating, spray coating, curtain coating, dip coating, air knife coating, blade coating and roll coating. When the coating amount is decreased, the apparent sensitivity is increased, but the film characteristic of the image recording layer is lowered.

A surface active agent, such as a fluorine surface active agent described in JP-A-62-170950, may be added to the coating composition for the image recording layer of the invention for improving the coating property. The addition amount thereof is generally from 0.01 to 1% by weight, and preferably from 0.05 to 0.5% by weight, based on the total solid content of the photosensitive layer.

The image recording material of the invention uses the particular alkali soluble polymer (A) which can form a firm coating film by rapid hardening as a binder, and thus it has such an advantage that deterioration in image forming property due to polymerization inhibition by oxygen can be suppressed. Therefore, it does not require a protective layer which has been generally used in a lithographic printing plate original having a heat mode negative polymerizable recording layer. However, the image recording material may have a protective layer using a water soluble polymer compound of relatively high crystallinity, such as polyvinyl alcohol, polyvinyl pyrrolidone, acidic cellulose, gelatin, gum arabic and polyacrylic acid, which can be easily removed by a developing process after exposure.

Support

The support used when a lithographic printing plate original is manufactured by using the image recording material of the invention is not particularly limited as long as it has a plate shape and dimensional stability. Examples thereof include paper, paper laminated with plastics (such as polyethylene, polypropylene and polystyrene), a metallic plate (such as aluminum, zinc and copper), and a plastic film (such as cellulose diacetate, cellulose triacetate, cellulose propionate, cellulose lactate, cellulose nitrate, polyethylene terephthalate, polyethylene, polystyrene, polypropylene, polycarbonate and polyvinyl acetal). These may be used as a sheet formed from a single material, such as a resin film and a metallic plate, or may be a laminated body of two or more materials. Examples of the laminated body include paper and a plastic film, on which a metal is laminated or vapor deposited, and a laminated sheet of plastic films of different kinds.

The support is preferably a polyester film or an aluminum plate, and an aluminum plate is particularly preferable since it has good dimensional stability and is relatively not expensive. Preferable examples of the aluminum plate include a pure aluminum plate and an alloy plate containing aluminum as a main component and a small amount of an additional element, and a plastic film having aluminum laminated or vapor deposited thereon may also be used. Examples of the additional element contained in the aluminum alloy include silicon, iron, manganese, copper, magnesium, chromium, zinc, bismuth, nickel and titanium. The content of the additional element in the alloy is 10% by weight at most. Preferable aluminum in the invention is pure aluminum. However, aluminum containing a slight amount of an additional element may be used because pure aluminum is difficult to be produced in view of smelting technology. That is, the aluminum plate used in the invention is not limited in terms of the composition thereof, and an aluminum plate formed with conventionally known materials may be appropriately used.

The thickness of the aluminum plate is generally about from 0.1 to 0.6 mm, preferably about from 0.15 to 0.4 mm, and particularly preferably about from 0.2 to 0.3 mm.

Before the surface of the aluminum plate is roughened, it is subjected, according to need, to a degreasing treatment with an organic solvent or an alkali aqueous solution in order to remove rolling oil on the surface.

The surface roughening of the aluminum plate is carried out by various methods, examples of which include a method of mechanically roughening, roughening by electrochemically dissolving the surface, and roughening by selective chemical dissolution of the surface. Examples of the mechanical method include ball polishing, brush polishing, blast polishing and buff polishing, which are known in the art. Examples of the electrochemical roughening method include using an alternating current or a direct current in a hydrochloric acid electrolyte or a nitric acid electrolyte. The method disclosed in JP-A-54-63902, in which both of the methods are combined, may also be utilized.

According to need, the aluminum plate having a surface thus roughened may be subjected to an alkali etching treatment and a neutralization treatment, and then subjected to an anodic oxidizing treatment for increasing the water holding capacity and the wear resistance of the surface. Examples of an electrolyte that can be used in the anodic oxidizing treatment of the aluminum plate include various electrolytes that form a porous oxide film. In general, sulfuric acid, phosphoric acid, oxalic acid, chromic acid and a mixed acid thereof. The concentration of the electrolyte is appropriately determined depending on the species of the electrolyte.

The conditions of the anodic oxidizing treatment cannot be simply determined because the conditions vary depending on the type of the electrolyte. In general, the concentration of the electrolyte is from 1 to 80% by weight, the solution temperature is from 5 to 70° C., the electric current density is from 5 to 60 $A/dm^2$, the electric voltage is from 1 to 100 V, and the electrolysis time is from 10 seconds to 5 minutes.

The amount of the anodic oxide film is preferably 1.0 $g/m^2$ or more, and more preferably from 2.0 to 6.0 $g/m^2$. When the amount of the anodic oxide film is less than 1.0 $g/m^2$, the printing durability may be insufficient or the non-image part of the lithographic printing plate is liable to be damaged, and as a result a so-called "scratch staining", in which ink attaches to the scratch upon printing, is liable to occur.

While the anodic oxidizing treatment is carried out on the surface of the support of the lithographic printing plate that is used for printing, an anodic oxide film of from 0.01 to 3 $g/m^2$ is generally formed on the back surface thereof due to wraparound of the electric flux lines.

The hydrophilic treatment of the surface of the support is carried out after the anodic oxidizing treatment by using a known treating method. Examples of the hydrophilic treatment include the methods using an alkali metal silicate (such as an aqueous solution of sodium silicate) described in U.S. Pat. Nos. 2,714,066, 3,181,461, 3,280,734 and 3,902,734. In these methods, the support is subjected to a dipping treatment or an electrolysis treatment with an aqueous solution of sodium silicate. The methods of treatment with potassium fluorozirconate described in Japanese Patent Publication No. 22063/1961 and with polyvinyl phosphoric acid described in U.S. Pat. Nos. 3,276,868, 4,153,461 and 4,689,272 may also be employed.

Among these, the silicate treatment is particularly preferably as the hydrophilic treatment in the invention.

The anodic oxide film of the aluminum plate having been subjected to the foregoing treatment is dipped in an aqueous solution having a concentration of an alkali metal silicate of from 0.1 to 30% by weight, preferably from 0.5 to 10% by weight, and pH at 25° C. of from 10 to 13 at a temperature of from 15 to 80° C. for a period of from 0.5 to 120 seconds. When the pH of the aqueous solution of an alkali metal silicate is less than 10, the solution gels, and when it exceeds 13.0, the oxide film dissolves. Examples of the alkali metal silicate used in the invention include sodium silicate, potassium silicate and lithium silicate. Examples of a hydroxide used for increasing the pH of the alkali metal silicate aqueous solution include sodium hydroxide, potassium hydroxide and lithium hydroxide. An alkaline earth metal salt or a metallic salt of the IVB group metal may be mixed with the treating solution. Examples of the alkaline earth metal salt include a nitrate, such as calcium nitrate, strontium nitrate, magnesium nitrate and barium nitrate, and a water soluble salt, such as a sulfate, a hydrochloride, a phosphate, an acetate, an oxalate and a borate. Examples of the metallic salt of the IVB group metal include titanium tetrachloride, titanium trichloride, titanium potassium fluoride, titanium potassium oxalate, titanium sulfate, titanium tetraiodide, zirconium chloride oxide, zirconium dioxide, zirconium oxychloride and zirconium tetrachloride. The alkaline earth metal salt and the metallic salt of the IVB group metal may be used singly or in combination of two or more. The concentration of the metallic salt is preferably from 0.01 to 10% by weight, and more preferably from 0.05 to 5.0% by weight.

The hydrophilicity of the surface of the aluminum plate is further improved by the treatment with a silicate, and thus it is difficult for ink to be attached to the non-image part upon printing, whereby the staining prevention is improved.

A back coating is provided on the back surface of the support according to need. Preferable examples of the back coating include coating layers formed with the organic polymer compound described in JP-A-5-45885 and the metallic oxide obtained by hydrolysis and polycondensation of an organic or inorganic metallic compound described in JP-A-6-35174.

Among the coating layers, an alkoxy compound of silicon, such as $Si(OCH_3)_4$, $Si(OC_2H_5)_4$, $Si(OC_3H_7)_4$ and $Si(OC_4H_9)_4$, are particularly preferable since they are inexpensive and easily available, and coating films of a metallic oxide provided by these compounds are excellent in development durability.

A lithographic printing plate original can be manufactured by using the image recording material of the invention according to the foregoing manner. The lithographic printing plate original can be recorded with an infrared laser. It can also be subjected to thermal recording with an ultraviolet ray lamp and a thermal head. In the invention, it is preferably subjected to imagewise exposure with a solid laser or a semiconductor laser emitting an infrared ray having a wavelength of from 760 to 1,200 nm.

After exposing with an infrared ray laser, the image recording material is developed preferably with water or an alkaline aqueous solution.

In the case where an alkali aqueous solution is used as a developing solution, known alkaline aqueous solutions may be used as the developing solution and a replenishing solution. Examples thereof include an inorganic alkali salt, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. An organic alkali agent may also be used, examples of which include monomethylamine, dimethylamine, trimethylamine, monethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkaline agents may be used singly or in combination of two or more.

In the case where the development is carried out by using an automatic developing machine, it is known that a large amount of lithographic printing plate originals can be processed without changing a developer solution in a developer tank for a long period of time by adding the same solution as the developer solution or an aqueous solution (replenishing solution) having a higher alkaline strength than the developer solution to the developing solution. This type of supplying method is preferably applied to the invention.

Various kinds of surface active agents and organic solvents may be added to the developer solution and the replenishing solution for acceleration or suppression of development, scattering of development dusts, and increase of affinity of an image part of the printing plate to ink. Preferable examples of the surface active agent include an anionic surface active agent, a cationic surface active agent, a nonionic surface active agent and an amphoteric surface active agent. Preferable examples of the organic solvent include benzyl alcohol. Polyethylene glycol, a derivative thereof, polypropylene glycol and a derivative thereof are also preferably added. A nonreducing sugar, such as arabitol, sorbitol, and mannitol, may also be added.

Furthermore, an inorganic salt based reducing agents, such as hydroquinone, resorcin, and a sodium salt and a potassium salt of sulfurous acid or bisulfurous acid, an organic carboxylic acid, a defoaming agent and a softening agent for hard water may also be added.

The printing plate having been subjected to the developing treatment by using the developer solution and the replenishing solution described in the foregoing is then subjected to a post-treatment with water for washing, a rinsing solution containing a surface active agent and a moistening solution containing gum arabic or starch derivatives. These treatments may be used in various combinations as the post-treatment when the image recording material of the invention is used as a printing plate material.

In recent years, an automatic developing machine for a printing plate is widely used for rationalization and standardization of prepress operations in the field of prepress and printing. The automatic developing machine generally has a developing section and a post-treating section with devices for transporting a printing plate, processing solution baths and spraying devices, in which an exposed printing plate is subjected to the developing treatment by spraying the treating solutions drawn by pumps to the printing plate from spray nozzles while the printing plate is horizontally transported. A method is also known in recent years in which a printing plate is transported with in-liquid guide rolls while immersed in treating baths filled with treating solutions. The automatic treatment may be carried out by supplying replenishing solutions to the respective treating solutions in accordance with the treating amount and the operation time. The replenishing solutions may also be supplied automatically by using a sensor to determine the electroconductivity.

A so-called disposable treating material may also be used, by which the printing plate is treated with a substantially unused treating solution.

The lithographic printing plate thus obtained is subjected to a printing step after applying moistening gum thereto according to need. In order to obtain a lithographic printing plate having higher printing durability, a burning treatment is carried out.

In the case where the lithographic printing plate is subjected to the burning treatment, it is preferable that the printing plate is treated with a surface adjusting solution described in JP-B-61-2518, JP-B-55-28062, JP-A-62-31859 and JP-A-61-159655 before burning.

The treatment with a surface adjusting solution can be carried out by such a method that the surface adjusting solution is coated on the lithographic printing plate with sponge or absorbent cotton soaked with the surface adjusting solution, the printing plate is dipped in a vat filled with the surface adjusting solution, or the surface adjusting solution is applied by an automatic coater. More preferable results can be obtained by making the applied amount thereof uniform by a squeezing or using a squeegee roller.

In general, the applied amount of the surface adjusting solution is suitably from 0.03 to 0.8 $g/m^2$ (dry amount). The lithographic printing plate having the surface adjusting solution applied thereto is dried according to need, and then heated to a high temperature by a burning processor (for example, a burning processor BP-1300 available from Fuji Photo Film Co., Ltd.). The heating temperature and the heating time herein are preferably from 180 to 300° C. for from 1 to 20 minutes while these vary depending on the type of the components constituting the image.

The lithographic printing plate having been subjected to the burning treatment may be subjected to the treatments that have been carried out in the conventional process, such as water washing and gum application. In the case where a surface adjusting solution containing a water soluble polymer compound is used, the so-called moistening treatment, such as gum application, can be omitted.

The lithographic printing plate obtained from the image recording material of the invention through the foregoing treatments is installed in an offset printing machine and is used for printing of a large number of sheets.

The invention will be described in more detail with reference to the following examples and comparative examples, but the invention should not be construed as being limited thereto.

EXAMPLES 1 TO 6 AND COMPARATIVE EXAMPLE 1

Preparation of Support

A molten liquid of an alloy according to JIS A1050 containing 99.5% or more of aluminum with 0.30% Fe, 0.10% of Si, 0.02% of Ti and 0.013% of Cu was subjected to a cleaning treatment and then cast. The cleaning treatment was carried out by conducting a degassing treatment of removing unnecessary gases, such as hydrogen, from the molten liquid and then conducting a treatment with a ceramic tube filter. The casting was carried out by the DC casting method. The surface of the solidified ingot having a thickness of 500 mm was ground by 10 mm, and it was subjected to a homogenization treatment at 550° C. for 10 hours to avoid intermetallic compounds being coarse. Subsequently, it was subjected to hot rolling at 400° C. and annealing in a continuous annealing furnace at 500° C. for 60 seconds, followed by cold rolling, so as to obtain an aluminum rolled plate having a thickness of 0.30 mm. The coarseness of the surface of the rolls was adjusted to control the center line surface roughness Ra after the cold rolling to 0.2 μm. Thereafter, it was applied to a tension leveler to improve the flatness.

A surface treatment for making a support for a lithographic printing plate was carried out.

The surface of the aluminum plate was subjected to a degreasing treatment with a 10% aqueous solution of sodium aluminate at 50° C. for 30 seconds to remove rolling oil and then subjected to a neutralizing and desmutting treatment with a 30% sulfuric acid aqueous solution at 50° C. for 30 seconds.

A so-called sand roughening treatment for roughening the surface of the support was carried out in order to improve the adhesiveness between the support and a recording layer and to impart water holding capacity to a non-image part. An aqueous solution containing 1% of nitric acid and 0.5% of aluminum nitrate was maintained at 45° C., and an aluminum web was passed therethrough, and an electric current with a density of 20 $A/dm^2$ in an alternating waveform with a duty ratio of 1/1 at an anodic electric amount of 240 $C/dm^2$ was applied by an indirect feeding cell, so as to carry out the sand roughening treatment. Thereafter, an etching treatment was carried out at 50° C. for 30 seconds with a 10% aqueous solution of sodium aluminate, and then a neutralizing and desmutting treatment was carried out with a 30% sulfuric acid aqueous solution at 50° C. for 30 seconds.

Furthermore, in order to improve the chemical resistance and the water holding capability, an oxide film was formed on the support through anodic oxidization. A 20% sulfuric acid aqueous solution at 35° C. was used as an electrolyte, and the aluminum web was passed therethrough, and a direct current of 14 $A/dm^2$ was applied by an indirect feeding cell to carry out an electrolysis treatment, whereby an anodic oxide film of 2.5 $g/m^2$ was formed.

Thereafter, a silicate treatment was carried out in order to ensure hydrophilicity of the non-image part of the printing plate. A 1.5% aqueous solution of sodium silicate No. 3 was maintained at 70° C., and the aluminum web was passed therethrough with the contact time being 15 seconds, and then washed with water. The amount of Si attached was 10 $mg/m^2$. The support thus obtained had a center line surface roughness Ra of 0.25 μm.

Preparation of Photosensitive Layer

The following photosensitive layer coating composition (P-1) was prepared and coated on the aluminum support obtained in the foregoing by using a wire bar. It was dried in a hot air dryer at 115° C. for 45 seconds to form a photosensitive layer, whereby a lithographic printing plate original was obtained. The coating amount after drying was in a range of from 1.2 to 1.3 $g/m^2$.

The polymer compound used in the Examples was the particular alkali soluble resin obtained in the foregoing Synthesis Examples. The alkali soluble resin B-1 used in the Comparative Example 1 was a benzyl methacrylate/methyl methacrylate copolymer (a polymer compound having a polymerization ratio of 80/20 by mole and a weight average molecular weight of 100,000).

Photosensitive Layer Coating Composition (P-1)

Alkali soluble resin (Component (A))
Compound and amount shown in Table 8

Radical polymerizable compound (Component (D))
Compound and amount shown in Table 8

TABLE 8

| | |
|---|---|
| Infrared ray absorbent (IR-6) (Component (B)) | 0.08 g |
| Iodonium salt (I-1) (Component (C)) | 0.30 g |
| Naphthalenesulfonate of Victoria Pure Blue | 0.04 g |
| Fluorine surface active agent | 0.01 g |
| (Megafac F-176, manufactured by Dainippon Ink and | |

TABLE 8-continued

| | |
|---|---|
| Chemicals, Inc.) | |
| Methyl ethyl ketone | 9.0 g |
| Methanol | 10.0 g |
| 1-methoxy-2-propanol | 8.0 g |

IR-6

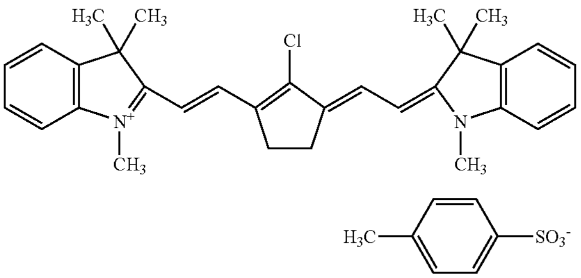

I-1

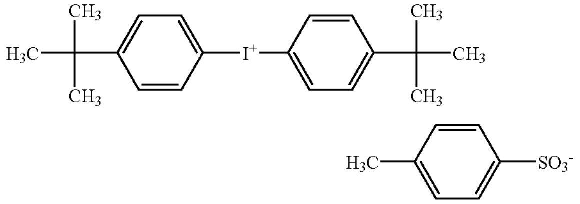

| | Polymer compound (amount) | Radical polymerizable compound (amount) | Ablation |
|---|---|---|---|
| Example 1 | Polymer compound 1<br>2.0 g | | none |
| Example 2 | Polymer compound 2<br>2.0 g | | none |
| Example 3 | Polymer compound 7<br>2.0 g | | none |
| Example 4 | Polymer compound 1<br>1.0 g | R-1<br>1.0 g | none |
| Example 5 | Polymer compound 2<br>1.0 g | R-1<br>1.0 g | none |
| Example 6 | Polymer compound 7<br>1.0 g | R-1<br>1.0 g | none |
| Comparative Example 1 | B-1<br>1.0 g | R-1<br>1.0 g | present |

R-1: dipentaerythritol hexaacrylate

Exposure

The resulting lithographic printing plate originals were subjected to exposure by using Trendsetter 3244VFS, manufactured by Creo Products, Inc., equipped with a water-cooled 40 W infrared semiconductor laser with an output power of 6.5 W, an outer surface drum rotation number of 81 rpm, an plate surface energy of 188 mJ/cm$^2$ and a resolution of 2,400 dpi. After the exposure, the presence of ablation on the plate was evaluated with the naked eye. The results are shown in Table 8.

It is clear from Table 8 that the lithographic printing plates of the Examples using the image recording material of the invention as the photosensitive layer could be recorded with no ablation upon exposure.

EXAMPLES 7 TO 12

The following photosensitive layer coating composition (P-2) was prepared and coated on the aluminum support by using a wire bar. It was dried in a hot air dryer at 115° C. for 45 seconds to obtain a lithographic printing plate original. The coating amount after drying was in a range of from 1.2 to 1.3 g/m$^2$.

Photosensitive Layer Coating Composition (P-2)

Alkali soluble resin (Component (A))

Compound and amount shown in Table 9

Radical polymerizable compound (Component (D))

Compound and amount shown in Table 9

| | |
|---|---|
| Infrared ray absorbent (IR-6) (Component (B)) | 0.08 g |
| Iodonium salt (I-1) (Component (C)) | 0.30 g |
| Naphthalenesulfonate of Victoria Pure Blue | 0.04 g |
| Fluorine surface active agent (Megafac F-176, manufactured by Dainippon Ink and Chemicals, Inc.) | 0.01 g |
| Methyl ethyl ketone | 9.0 g |
| Methanol | 10.0 g |
| 1-methoxy-2-propanol | 8.0 g |

TABLE 9

| | Polymer compound (amount) | Radical polymerizable compound (amount) | Printing durability |
|---|---|---|---|
| Example 7 | Polymer compound 1<br>2.0 g | | 55,000 sheets |
| Example 8 | Polymer compound 2<br>2.0 g | | 52,000 sheets |
| Example 9 | Polymer compound 7<br>2.0 g | | 55,000 sheets |
| Example 10 | Polymer compound 11<br>1.0 g | R-1<br>1.0 g | 53,000 sheets |
| Example 11 | Polymer compound 14<br>1.0 g | R-2<br>1.0 g | 55,000 sheets |
| Example 12 | Polymer compound 18<br>1.0 g | R-1<br>1.0 g | 54,000 sheets |
| Comparative Example 1 | B-1<br>1.0 g | R-1<br>1.0 g | 23,000 sheets |

R-2: pentaerythritol tetraacrylate

Exposure

After the exposure, the resulting lithographic printing plate originals were subjected to exposure by using Trendsetter 3244VFS, manufactured by Creo Products, Inc., equipped with a water-cooled 40 W infrared semiconductor laser at an output power of 9 W, an outer surface drum rotation number of 210 rpm, an energy at plate surface of 100 mJ/cm$^2$ and a resolution of 2,400 dpi.

Developing Treatment

The printing plates were subjected to a developing treatment by using an automatic developing machine STABLON 900N, manufactured by Fuji Photo Film Co., Ltd. The developer solutions, both the charged solution and the replenishing solution, were a 1/1 diluted aqueous solution of DN-3C, manufactured by Fuji Photo Film Co., Ltd. The temperature of the developer bath was 30° C. The finisher was a 1/1 diluted aqueous solution of FN-6, manufactured by Fuji Photo Film Co., Ltd.

Evaluation of Printing Durability

Printing was then carried out by using a printing machine, Lithrone, manufactured by Komori Corp. At this time, the number of sheets that could be printed with sufficient ink density was determined using the naked eye to thereby evaluate the printing durability. The results are shown in Table 9. The lithographic printing plate obtained in the Comparative Example 1 was also evaluated for printing durability in the same manner. The result is shown in Table 9.

It is understood from the results of Table 9 that the lithographic printing plates using the image recording material of the invention as the photosensitive layer exhibit excellent printing durability in comparison to the Comparative Example 1 using the known water insoluble and alkali soluble resin.

EXAMPLES 13 TO 17

Lithographic printing plate originals were obtained in the same manner as in the Example 1 except that the compositions of the photosensitive layer coating compositions were changed to the following compositions. The printing plate originals were subjected to the laser scanning exposure and the developing treatment in the same manner as in the Example 1, so as to obtain printing plates. The printing plates thus obtained were subjected to printing in the same manner as in the Example 1 to evaluate the sensitivity, the printing durability and the staining property. The resulting lithographic printing plate originals were subjected to forced aging by storing at 60° C. for 3 days and storing at 45° C. and a humidity of 75% RH for 3 days, and then subjected to printing in the same manner as in the foregoing. The results obtained are shown in Table 10.

Photosensitive Layer Coating Composition (P-3)

Alkali soluble resin (Component (A))
  Compound and amount shown in Table 10

Radical polymerizable compound (Component (D))
  Compound and amount shown in Table 10

TABLE 10

| | |
|---|---|
| Infrared ray absorbent (IR-6) (Component (B)) | 0.08 g |
| Sulfonium salt (S-1) (Component (C)) | 0.30 g |
| Naphthalenesulfonate of Victoria Pure Blue | 0.04 g |
| Fluorine surface active agent | 0.01 g |
| (Megafac F-176, manufactured by Dainippon Ink and Chemicals, Inc.) | |
| Methyl ethyl ketone | 9.0 g |
| Methanol | 10.0 g |
| 1-Methoxy-2-propanol | 8.0 g |

| | Polymer compound | Radical polymerizable compound | Printing durability and staining of non-image part | | |
|---|---|---|---|---|---|
| | (amount) | (amount) | No forced aging | 60° C. for 3 days | 45° C., 75% for 3 days |
| Example 13 | Polymer compound 1 2.0 g | | 55,000 sheets No staining | 55,000 sheets No staining | 55,000 sheets No staining |
| Example 14 | Polymer compound 2 2.0 g | | 52,000 sheets No staining | 52,000 sheets No staining | 52,000 sheets No staining |
| Example 15 | Polymer compound 7 2.0 g | | 53,000 sheets No staining | 53,000 sheets No staining | 53,000 sheets No staining |
| Example 16 | Polymer compound 11 1.0 g | R-1 1.0 g | 54,000 sheets No staining | 54,000 sheets No staining | 54,000 sheets No staining |
| Example 17 | Polymer compound 14 1.0 g | R-2 1.0 g | 53,000 sheets No staining | 53,000 sheets No staining | 53,000 sheets No staining |

S-1

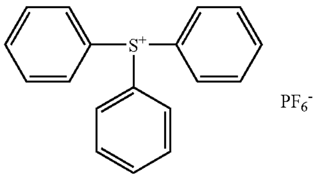

It was understood from Table 10 that the lithographic printing plates using the image recording material of the invention as the photosensitive layer exhibited no staining on the non-image part and were excellent in printing durability. They did not suffer deterioration in printing durability on staining on the non-image part even after storing at a high temperature and high humidity environment, and thus it was understood that they were excellent in storage stability.

EXAMPLES 18 TO 23 AND COMPARATIVE EXAMPLE 2

Preparation of Support

An aluminum plate having a thickness of 0.30 mm was subjected to sand roughening by using a nylon brush and an aqueous suspension of pumice of 400 mesh, and then washed well with water. After etching by dipping in a 10% by weight aqueous solution of sodium hydroxide at 700° C. for 60 seconds, it was washed with flowing water and neutralized with 20% by weight nitric acid, and then washed with water. It was then subjected to an electrolytic surface roughening treatment by using an electric current of an alternating waveform of sine wave under the condition of $V_A$=12.7 V in a 1% by weight nitric acid aqueous solution with an anodic electric amount of 160 C/dm$^2$. The surface roughness was measured, and it was 0.6 μm in terms of Ra. It was then dipped in a 30% by weight sulfuric acid aqueous solution at 55° C. for 2 minutes for desmutting, and then subjected to an anodic oxidizing treatment in a 20% by weight sulfuric acid solution at an electric current density of 2 A/dm$^2$ for 2 minutes to form an anodic oxide film having a thickness of 2.7 g/m$^2$.

Preparation of Undercoating Layer

A liquid composition of an SG method (sol liquid) was prepared in the following manner.

Sol Liquid Composition

| | |
|---|---|
| Methanol | 130 g |
| Water | 20 g |
| 85% by weight phosphoric acid | 16 g |
| Tetraethoxysilane | 50 g |
| 3-Methacryloxypropyl trimethoxysilane | 60 g |

The foregoing sol liquid composition was mixed and stirred. Formation of heat was observed after about 5 minutes. After reacting for 60 minutes, the content was put in another vessel, to which 3,000 g of methanol was added, so as to obtain a sol liquid.

The sol liquid was diluted with a mixed solvent of methanol/ethylene glycol (9/1 by weight) and coated in such an amount that the amount of Si on the support was 3 mg/m$^2$, and then dried at 100° C. for 1 minute.

The photosensitive layer coating composition having the following composition (P-4) was coated on the aluminum support having the undercoating provided by using a wire bar and dried in a hot air dryer at 115° C. for 45 seconds, so as to obtain a lithographic printing plate original. The coating amount after drying was in a range of from 1.2 to 1.3 g/m$^2$.

The alkali soluble resin B-2 used in the Comparative Example 2 was a methyl methacrylate/methacrylic acid copolymer (a polymer compound having a polymerization ratio of 75/22 by mole and a weight average molecular weight of 80,000).

Photosensitive Layer Coating Composition (P-4)

Alkali soluble resin (Component (A))

Compound and amount shown in Table 11

Radical polymerizable compound (Component (D))

Compound and amount shown in Table 11

TABLE 11

| | |
|---|---|
| Infrared ray absorbent (IR-1) (Component (B)) | 0.08 g |
| Iodonium salt (I-1) (Component (C)) | 0.30 g |
| Naphthalenesulfonate of Victoria Pure Blue | 0.04 g |
| Fluorine surface active agent (Megafac F-176, manufactured by Dainippon Ink and Chemicals, Inc.) | 0.01 g |
| Methyl ethyl ketone | 9.0 g |
| Methanol | 10.0 g |
| 1-Methoxy-2-propanol | 8.0 g |

TABLE 11-continued

| | Polymer compound (amount) | Radical polymerizable compound (amount) | Printing durability | Staining on non-image part |
|---|---|---|---|---|
| Example 18 | Polymer compound 1 2.0 g | | 75,000 sheets | none |
| Example 19 | Polymer compound 2 2.0 g | | 72,000 sheets | none |
| Example 20 | Polymer compound 7 2.0 g | | 75,000 sheets | none |
| Example 21 | Polymer compound 1 1.0 g | R-1 1.0 g | 75,000 sheets | none |
| Example 22 | Polymer compound 2 1.0 g | R-1 1.0 g | 71,000 sheets | none |
| Example 23 | Polymer compound 7 1.0 g | R-1 1.0 g | 74,000 sheets | none |
| Comparative Example 2 | B-2 1.0 g | R-1 1.0 g | 48,000 sheets | staining |

IR-1

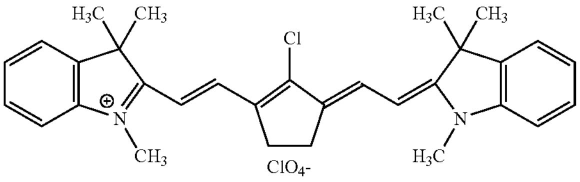

Exposure

The resulting lithographic printing plate originals were subjected to exposure by using Luxel T-9000CTP, manufactured by Fuji Photo Film Co., Ltd., equipped with a multi-channel laser head at an output power per beam of 250 mW, an outer surface drum rotation number of 800 rpm and a resolution of 2,400 dpi.

Developing Treatment

After the exposure, the printing plates were subjected to a developing treatment by using an automatic developing machine STABLON 900N, manufactured by Fuji Photo Film Co., Ltd. The developer solutions, both the charged solution and the replenishing solution, were a 1/8 diluted aqueous solution of DP-4, manufactured by Fuji Photo Film Co., Ltd. The temperature of the developer bath was 30° C. The finisher was a 1/2 diluted aqueous solution of GU-7, manufactured by Fuji Photo Film Co., Ltd.

Evaluation of Printing Durability and Staining

Printing was then carried out by using a printing machine, Heidelberg SOR-KZ. At this time, the number of sheets that could be printed with sufficient ink density was determined with the naked eye to thereby evaluate the printing durability. The staining on the non-image part of the resulting printed matter was evaluated with the naked eye. The results are shown in Table 11.

It is understood from the results of Table 11 that the lithographic printing plates using the image recording material of the invention as the photosensitive layer exhibit no staining on the non-image part and have excellent printing durability.

EXAMPLES 24 TO 28

Preparation of Undercoating Layer

The following undercoating layer coating composition was coated on the same aluminum support as used in the Examples 1 to 6 by using a wire bar and then dried in a hot air dryer at 90° C. for 30 seconds. The coating amount after drying was 10 $mg/m^2$.

Undercoating Layer Coating Composition

Copolymer of ethyl methacrylate and sodium 2-acrylamide-2-methyl-1-propanesulfonate (75/15 by mole)

| | |
|---|---|
| 2-Aminoethyl phosphoric acid | 0.1 g |
| Methanol | 50 g |
| Ion exchanged water | 50 g |

The photosensitive layer coating composition having the following composition (P-5) was coated on the aluminum support thus treated by using a wire bar and dried in a hot air dryer at 115° C. for 45 seconds, so as to obtain a lithographic printing plate original. The coating amount after drying was in a range of from 1.2 to 1.3 $g/m^2$.

Photosensitive Layer Coating Composition (P-5)

Alkali soluble resin (Component (A))

Compound and amount shown in Table 12

Radical polymerizable compound (Component (D))

Compound and amount shown in Table 12

| | |
|---|---|
| Infrared ray absorbent (IR-1) (Component (B)) | 0.08 g |
| Iodonium salt (I-1) (Component (C)) | 0.30 g |
| Naphthalenesulfonate of Victoria Blue | 0.04 g |
| Fluorine surface active agent (Megafac F-176, manufactured by Dainippon Ink and Chemicals, Inc.) | 0.01 g |
| Methyl ethyl ketone | 9.0 g |
| Methanol | 10.0 g |
| 1-Methoxy-2-propanol | 8.0 g |

TABLE 12

| | Polymer compound (amount) | Radical polymerizable compound (amount) | Printing durability |
|---|---|---|---|
| Example 24 | Polymer compound 2 2.0 g | | 63,000 sheets |
| Example 25 | Polymer compound 9 2.0 g | | 62,000 sheets |
| Example 26 | Polymer compound 16 2.0 g | | 64,000 sheets |
| Example 27 | Polymer compound 2 1.0 g | R-1 1.0 g | 63,000 sheets |
| Example 28 | Polymer compound 2 1.0 g | R-2 1.0 g | 62,000 sheets |

The resulting lithographic printing plate originals were subjected to the exposure and the developing treatment in the same manner as in the Examples 1 to 6 except that a 1/4 diluted aqueous solution of CA-1, manufactured by Fuji Photo Film Co., Ltd., was used as a developer solution, and they were subjected to printing to be evaluated for printing durability. The results obtained are shown in Table 12.

It is understood from Table 12 that the lithographic printing plates using the image recording material of the invention as the photosensitive layer are excellent in printing durability.

EXAMPLES 29 TO 33

A photosensitive layer was formed on an aluminum support in the same manner as in the Examples 7 to 12. A 3% by weight aqueous solution of polyvinyl alcohol (saponification degree: 86.5 to 89 mol %, polymerization degree: 1,000) was coated thereon to obtain a dry coating amount of 2 $g/m^2$ and dried at 100° C. for 2 minutes, so as to form a protective layer on the photosensitive layer, whereby lithographic printing plate original were obtained.

The resulting lithographic printing plate originals were subjected to the exposure and the developing treatment in the same manner as in the Examples 7 to 12, and were subjected to printing to evaluate printing durability. The results obtained are shown in Table 13.

TABLE 13

| | Polymer compound (amount) | Radical polymerizable compound (amount) | Printing durability |
|---|---|---|---|
| Example 29 | Polymer compound 11 2.0 g | | 73,000 sheets |
| Example 30 | Polymer compound 17 2.0 g | | 72,000 sheets |
| Example 31 | Polymer compound 23 2.0 g | | 74,000 sheets |
| Example 32 | Polymer compound 11 1.0 g | R-1 1.0 g | 73,000 sheets |
| Example 33 | Polymer compound 17 1.0 g | R-2 1.0 g | 72,000 sheets |

It is understood from Table 13 that the lithographic printing plates using the image recording material of the invention as the photosensitive layer are excellent in printing durability, and it is observed that the printing durability is improved by providing a protective layer. According to this aspect of the invention, such a negative image recording material is provided that digital data from computers can be directly recorded by recording with a solid laser or a semiconductor laser emitting an infrared ray, and in the case where it is used as a photosensitive layer of a lithographic printing plate original, an image of high strength can be obtained without causing ablation thereby realizing high printing durability.

EXAMPLES 34 TO 38 AND COMPARATIVE EXAMPLES 3 AND 4

Preparation of Support

A molten liquid of an alloy according to JIS A1050 containing 99.5% or more of aluminum with 0.30% Fe, 0.10% of Si, 0.02% of Ti and 0.013% of Cu was subjected to a cleaning treatment and then cast. The cleaning treatment was carried out by conducting a degassing treatment for removing unnecessary gases, such as hydrogen, from the molten liquid and then conducting a treatment with a ceramic tube filter. The casting was carried out by the DC casting method. The surface of the solidified ingot having a thickness of 500 mm was ground to 10 mm, and it was subjected to a homogenization treatment at 550° C. for 10 hours to avoid intermetallic compounds being coarse. Subsequently, it was subjected to hot rolling at 400° C. and annealing in a continuous annealing furnace at 500° C. for 60 seconds, followed by cold rolling, so as to obtain an aluminum rolled plate having a thickness of 0.30 mm. The coarseness of the surface of the rolls was adjusted to control the center line surface roughness Ra after the cold rolling to 0.2 μm. Thereafter, a tension leveler was applied to improve the flatness.

A surface treatment for making a support for a lithographic printing plate was carried out.

The surface of the aluminum plate was subjected to a degreasing treatment with a 10% aqueous solution of sodium aluminate at 50° C. for 30 seconds to remove rolling oil and then subjected to a neutralizing and desmutting treatment with a 30% sulfuric acid aqueous solution at 50° C. for 30 seconds.

A so-called sand roughening treatment for roughening the surface of the support was carried out in order to improve the adhesiveness between the support and a recording layer and to impart water holding capacity to a non-image part. An aqueous solution containing 1% of nitric acid and 0.5% of aluminum nitrate was maintained at 45° C., and an aluminum web was passed therethrough, and an electric current of a density of 20 A/dm$^2$ in an alternating waveform having a duty ratio of 1/1 at an anodic electric amount of 240 C/dm$^2$ was applied by an indirect feeding cell, so as to carry out the sand roughening treatment. Thereafter, an etching treatment was carried out at 50° C. for 30 second with a 10% aqueous solution of sodium aluminate, and then a neutralizing and desmutting treatment was carried out with a 30% sulfuric acid aqueous solution at 50° C. for 30 seconds.

Furthermore, in order to improve the chemical resistance and the water holding capability, an oxide film was formed on the support through anodic oxidization. A 20% sulfuric acid aqueous solution at 35° C. was used as an electrolyte, and the aluminum web was passed therethrough, and a direct current of 14 A/dm$^2$ was applied by an indirect feeding cell to carry out an electrolysis treatment, whereby an anodic oxide film of 2.5 g/m$^2$ was formed.

Thereafter, a silicate treatment was carried out in order to ensure hydrophilicity of the non-image part of the printing plate. A 1.5% aqueous solution of sodium silicate No. 3 was maintained at 70° C., and the aluminum web was passed therethrough with the contact time being 15 seconds, and then washed with water. The amount of Si attached was 10 mg/m$^2$. The support thus obtained had a center line surface roughness Ra of 0.25 μm.

Preparation of Photosensitive Layer

The following photosensitive layer coating composition (P-6) was prepared and coated on the aluminum support obtained in the foregoing by using a wire bar. It was dried in a hot air dryer at 115° C. for 45 seconds to form a photosensitive layer, whereby a lithographic printing plate original was obtained. The coating amount after drying was in a range of from 1.2 to 1.3 g/m$^2$.

The polymer compound used in the Examples was the particular alkali soluble resin obtained in the foregoing Synthesis Examples. The polymer compound used in the Comparative Example 3 (alkali soluble resin B-1) will be described later. The radical polymerizable compound HPHA is dipentaerythritol hexaacrylate.

Photosensitive Layer Coating Composition (P-6)

Alkali soluble resin (Component (A))

Compound and amount shown in Table 14

Radical polymerizable compound (Component (D))

Compound and amount shown in Table 14

TABLE 14

| | |
|---|---|
| Infrared ray absorbent (IR-6) (Component (B)) | 0.08 g |
| Polymerization initiator (S-2) (Component (C)) | 0.30 g |
| Naphthalenesulfonate of Victoria Pure Blue | 0.04 g |
| Fluorine surface active agent | 0.01 g |
| (Megafac F-176, manufactured by Dainippon Ink and Chemicals, Inc.) | |
| Methyl ethyl ketone | 9.0 g |
| Methanol | 10.0 g |
| 1-Methoxy-2-propanol | 8.0 g |

| | Polymer compound (amount) | Radical polymerizable compound (amount) | Ablation |
|---|---|---|---|
| Example 34 | Polymer compound 24 2.0 g | None | none |
| Example 35 | Polymer compound 25 2.0 g | None | none |
| Example 36 | Polymer compound 24 1.0 g | DPHA 1.0 g | none |
| Example 37 | Polymer compound 25 1.0 g | DPHA 1.0 g | none |
| Comparative Example 3 | B-1 2.0 g | None | present |
| Comparative Example 4 | B-1 1.0 g | DPHA 1.0 g | present |

IR-6

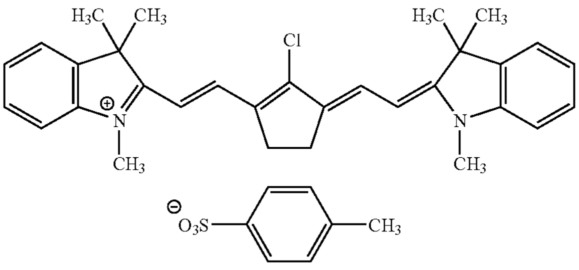

S-2

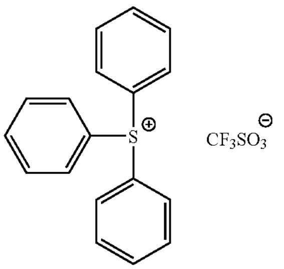

Exposure

The resulting lithographic printing plate originals were subjected to exposure by using Trendsetter 3244VFS, manufactured by Creo Products, Inc., equipped with a water-cooled 40 W infrared semiconductor laser at an output power of 6.5 W, an outer surface drum rotation number of 81 rpm, an energy at plate surface of 188 $mJ/cm^2$ and a resolution of 2,400 dpi. After the exposure, the presence of ablation on the plate was evaluated with the naked eye. The results are shown in Table 14.

It is clear from Table 14 that the lithographic printing plates of the Examples using the image recording material of the invention as the photosensitive layer could be recorded with no ablation upon exposure.

EXAMPLES 38 TO 43 AND COMPARATIVE EXAMPLES 5 AND 6

The following undercoating layer coating composition was coated on the aluminum support and then dried under an 80° C. environment for 30 seconds. The coating amount after drying was 10 $mg/m^2$.

Undercoating Layer Coating Composition

The following components were mixed to prepare a coating composition for an undercoating layer.

| | |
|---|---|
| 2-Aminoethyl phosphoric acid | 0.5 g |
| Methanol | 40 g |
| Pure water | 60 g |

The photosensitive layer coating composition having the following composition (P-7) was coated on the aluminum support having the undercoating layer by using a wire bar and dried in a hot air dryer at 115° C. for 45 seconds, so as to obtain a lithographic printing plate original. The coating amount after drying was in a range of from 1.2 to 1.3 $g/m^2$.

The polymer compounds used in the Examples were the particular alkali soluble polymers obtained in the foregoing Synthesis Examples. The term ATMMT refers to pentaerythritol tetraacrylate. (Hereinafter, the constitutional structure of the alkali soluble polymer B-1 used in the Comparative Examples 3 to 6 is shown.)

Photosensitive Layer Coating Composition (P-7)

Alkali soluble resin (Component (A))
Compound and amount shown in Table 15

Radical polymerizable compound (Component (D))
Compound and amount shown in Table 15

TABLE 15

| | |
|---|---|
| Infrared ray absorbent (IR-2) (Component (B)) | 0.08 g |
| Polymerization initiator (S-3) (Component (C)) | 0.30 g |
| Naphthalenesulfonate of Victoria Pure Blue | 0.04 g |
| Fluorine surface active agent | 0.01 g |
| (Megafac F-176, manufactured by Dainippon Ink and Chemicals, Inc.) | |
| N-Nitroso-N-phenylhydroxylamine aluminum | 0.001 g |
| Methyl ethyl ketone | 9.0 g |
| Methanol | 10.0 g |
| 1-Methoxy-2-propanol | 8.0 g |

| | Polymer compound (amount) | Radical polymerizable compound (amount) | Printing durability |
|---|---|---|---|
| Example 38 | Polymer compound 24 2.0 g | None | 60,000 sheets |
| Example 39 | Polymer compound 25 2.0 g | None | 70,000 sheets |
| Example 40 | Polymer compound 26 2.0 g | None | 75,000 sheets |
| Example 41 | Polymer compound 25 1.0 g | DPHA 1.0 g | 65,000 sheets |
| Example 42 | Polymer compound 29 1.0 g | DPHA 1.0 g | 67,000 sheets |
| Example 43 | Polymer compound 32 1.0 g | ATMMT 1.0 g | 64,000 sheets |
| Comparative Example 5 | B-1 2.0 g | none | 2,000 sheets |
| Comparative Example 6 | B-1 1.0 g | DPHA 1.0 g | 10,000 sheets |

TABLE 15-continued

IR-2

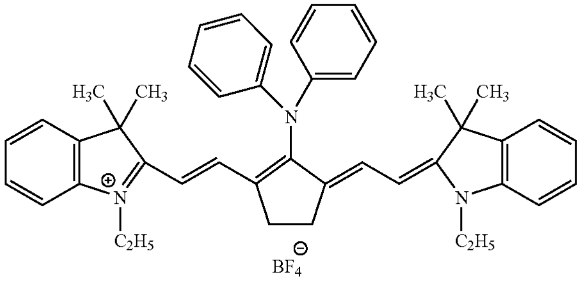

S-3

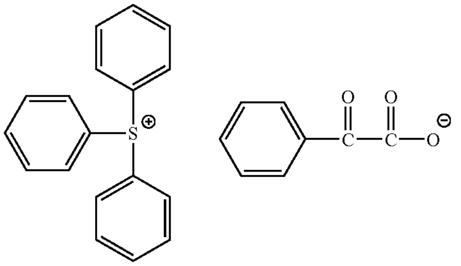

B-1

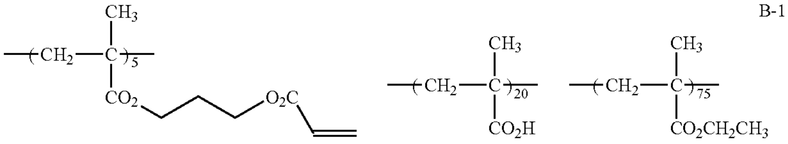

Mw 95,000

Exposure

The resulting lithographic printing plate originals were subjected to exposure by using Trendsetter 3244VFS, manufactured by Creo Products, Inc., equipped with a water-cooled 40 W infrared semiconductor laser with an output power of 9 W, an outer surface drum rotation number of 210 rpm, a plate surface energy of 133 $mJ/cm^2$ and a resolution of 2,400 dpi.

Developing Treatment

After the exposure, the printing plates were subjected to a developing treatment by using an automatic developing machine STABLON 900NP, manufactured by Fuji Photo Film Co., Ltd. The developer solutions used were the following solution D-1 for the charged solution and the following solution D-2 for the replenishing solution. The temperature of the developer bath was 30° C., and the developing time was 12 seconds. At this time, the replenishing solution was automatically added in such a manner that the electroconductivity of the developing solution in the developing bath was constant. The finisher was a 1/1 diluted aqueous solution of FN-6, manufactured by Fuji Photo Film Co., Ltd.

(Developer Solution D-1))

| | |
|---|---|
| (Developer Solution D-1)) | |
| Potassium hydroxide | 3 g |
| Potassium bicarbonate | 1 g |

-continued

| | |
|---|---|
| Potassium carbonate | 2 g |
| Sodium sulfite | 1 g |
| Polyethylene glycol mononaphthyl ether | 150 g |
| Sodium dibutylnaphthalene sulfonate | 50 g |
| Tetrasodium ethylenediamine tetraacetate | 8 g |
| Water | 785 g |
| (Developer Solution D-2)) | |
| Potassium hydroxide | 6 g |
| Potassium carbonate | 2 g |
| Sodium sulfite | 1 g |
| Polyethylene glycol mononaphthyl ether | 150 g |
| Sodium dibutylnaphthalene sulfonate | 50 g |
| Potassium hydroxyethane diphosphonate | 4 g |
| Silicone TSA-731 (manufactured by Toshiba Silicone Co., Ltd.) | 0.1 g |
| Water | 786.9 g |

Evaluation of Printing Durability

Printing was then carried out by using a printing machine, Lithrone, manufactured by Komori Corp. At this time, the number of sheets that could be printed with sufficient ink density was determined with the naked eye thereby evaluating the printing durability. The results are shown in Table 15.

It is understood from the results of Table 15 that the lithographic printing plates using the image recording material of the invention as the photosensitive layer exhibit excellent printing durability in comparison to the Comparative Examples 5 and 6 using the known water insoluble and alkali soluble resins.

EXAMPLES 44 TO 47 AND COMPARATIVE EXAMPLE 7

Preparation of Support

An aluminum plate having a thickness of 0.30 mm was subjected to sand roughening by using a nylon brush and an aqueous suspension of pumice of 400 mesh, and then washed well with water. After etching by dipping in a 10% by weight aqueous solution of sodium hydroxide at 70° C. for 60 seconds, it was washed with flowing water and neutralized with 20% by weight nitric acid, and then washed with water. It was then subjected to an electrolytic surface roughening treatment by using an electric current of an alternating waveform of sine wave under the condition of $V_A$=12.7 V in a 1 % by weight nitric acid aqueous solution with an anodic electric amount of 160 C/dm$^2$. The surface roughness was measured, and it was 0.6 μm in terms of Ra. It was then dipped in a 30% by weight sulfuric acid aqueous solution at 55° C. for 2 minutes for desmutting, and then subjected to an anodic oxidizing treatment in a 20% by weight sulfuric acid solution at an electric current density of 2 A/dm$^2$ for 2 minutes to form an anodic oxide film having a thickness of 2.7 g/m$^2$. Thereafter, the coating composition for an undercoating layer was coated thereon and dried under an 80° C. environment for 30 seconds. The dry coating amount was 10 mg/m$^2$.

Preparation of Photosensitive Layer

The following photosensitive layer coating composition (P-8) was prepared and coated on the aluminum support thus obtained in the foregoing by using a wire bar. It was dried in a hot air dryer at 115° C. for 45 seconds to obtain a lithographic printing plate original. The coating amount after drying was in a range of from 1.2 to 1.3 g/m$^2$. They were then subjected to the laser scanning exposure and developing treatment in the same manner as in Example 38 to obtain lithographic printing plates.

Photosensitive Layer Coating Composition (P-8)

Alkali soluble resin (Component (A'))

Compound and amount shown in Table 16

Radical polymerizable compound (Component (D))

Compound and amount shown in Table 16

| | |
|---|---|
| Infrared ray absorbent (IR-2) (Component (B)) | 0.08 g |
| Polymerization initiator (S-3) (Component (C')) | 0.30 g |
| Naphthalenesulfonate of Victoria Pure Blue | 0.04 g |
| Fluorine surface active agent | 0.01 g |
| (Megafac F-176, manufactured by Dainippon Ink and Chemicals, Inc.) | |
| t-Butylcatechol | 0.001 g |
| Methyl ethyl ketone | 9.0 g |
| Methanol | 10.0 g |
| 1-Methoxy-2-propanol | 8.0 g |

TABLE 16

| | Polymer compound (amount) | Radical polymerizable compound (amount) | Printing durability and Staining of non-image part: No forced aging | 60° C. for 3 days | 45° C., 75% for 3 days |
|---|---|---|---|---|---|
| Example 44 | Polymer compound 31 2.0 g | None | 60,000 sheets No staining | 60,000 sheets No staining | 60,000 sheets No staining |
| Example 45 | Polymer compound 28 1.0 g | None | 55,000 sheets No staining | 55,000 sheets No staining | 55,000 sheets No staining |
| Example 46 | Polymer compound 24 1.0 g | DPHA 5.0 g U-1 0.5 g | 65,000 sheets No staining | 65,000 sheets No staining | 65,000 sheets No staining |
| Example 47 | Polymer compound 25 1.0 g | DPHA 5.0 g U-1 0.5 g | 63,000 sheets No staining | 63,000 sheets No staining | 63,000 sheets No staining |
| Comparative Example 7 | B-2 1.0 g | DPHA 5.0 g U-1 0.5 g | 20,000 sheets Contaminated | 18,000 sheets Contaminated | 10,000 sheets Contaminated |

U-1

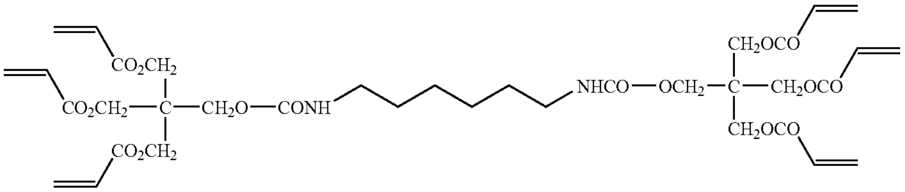

TABLE 16-continued

| | |
|---|---|
| 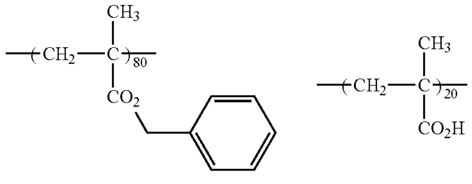 Mw 92,000 | B-2 |

Developing Treatment

The printing plates thus obtained were subjected to printing in the same manner as in the Example 40 to evaluate the sensitivity, the printing durability and the staining property. The resulting lithographic printing plate originals were subjected to forced aging by storing at 60° C. for 3 days and storing at 45° C. and a humidity of 75% RH for 3 days, and then subjected to printing in the same manner as in the foregoing. The results obtained are shown in Table 16.

It was understood from Table 16 that the lithographic printing plates using the image recording material of the invention as the photosensitive layer exhibited no staining on the non-image part and were excellent in printing durability. They did not suffer deterioration in printing durability on staining on the non-image part even after being stored in a high temperature and high humidity environment, and thus it was understood that they were excellent in storage stability.

EXAMPLES 48 TO 51 AND COMPARATIVE EXAMPLE 8

Preparation of Support

An aluminum plate having a thickness of 0.30 mm was subjected to sand roughening by using a nylon brush and an aqueous suspension of pumice of 400 mesh, and then washed well with water. After etching by dipping in a 10% by weight aqueous solution of sodium hydroxide at 70° C. for 60 seconds, it was washed with flowing water and neutralized with 20% by weight nitric acid, and then washed with water. It was then subjected to an electrolytic surface roughening treatment by using an electric current of an alternating waveform of sine wave under the condition of $V_A$=12.7 V in a 1% by weight nitric acid aqueous solution with an anodic electric amount of 160 C/dm$^2$. The surface roughness was measured, and it was 0.6 μm in terms of Ra. It was then dipped in a 30% by weight sulfuric acid aqueous solution at 55° C. for 2 minutes for desmutting, and then subjected to an anodic oxidizing treatment in a 20% by weight sulfuric acid solution at an electric current density of 2 A/dm$^2$ for 2 minutes to form an anodic oxide film having a thickness of 2.7 g/m$^2$.

Preparation of Undercoating Layer

A liquid composition of an SG method (sol liquid) was prepared in the following manner.

Sol Liquid Composition

| | |
|---|---|
| Methanol | 130 g |
| Water | 20 g |
| 85% by weight phosphoric acid | 16 g |
| Tetraethoxysilane | 50 g |
| 3-Methacryloxypropyl trimethoxysilane | 60 g |

The foregoing sol liquid composition was mixed and stirred. Formation of heat was observed after about 5 minutes. After reacting for 60 minutes, the content was put in another vessel, to which 3,000 g of methanol was added, so as to obtain a sol liquid.

The sol liquid was diluted with a mixed solvent of methanol/ethylene glycol (9/1 by weight) and coated in such an amount that the amount of Si on the support was 30 mg/m$^2$, and then dried at 100° C. for 1 minute.

The photosensitive layer coating composition having the following composition (P-9) was coated on the aluminum support having the undercoating provided by using a wire bar and dried in a hot air dryer at 115° C. for 45 seconds, so as to obtain a lithographic printing plate original. The coating amount after drying was in a range of from 1.2 to 1.3 g/m$^2$.

Photosensitive Layer Coating Composition (P-9)

Alkali soluble resin (Component (A))

Compound and amount shown in Table 17

Radical polymerizable compound (Component (D))

Compound and amount shown in Table 17

TABLE 17

| | |
|---|---|
| Infrared ray absorbent (IR-1) (Component (B)) | 0.08 g |
| Polymerization initiator (S-2) (Component (C)) | 0.30 g |
| Naphthalenesulfonate of Victoria Pure Blue | 0.04 g |
| Fluorine surface active agent | 0.01 g |
| (Megafac F-176, manufactured by Dainippon Ink and Chemicals, Inc.) | |
| Methyl ethyl ketone | 9.0 g |
| Methanol | 10.0 g |
| p-Methoxyphenol | 0.001 g |
| 1-Methoxy-2-propanol | 8.0 g |

TABLE 17-continued

| | Polymer compound (amount) | Radical polymerizable compound (amount) | Printing durability | Staining on non-image part |
|---|---|---|---|---|
| Example 48 | Polymer compound 25 2.0 g | none | 80,000 sheets | none |
| Example 49 | Polymer compound 25 2.0 g | DPHA 1.0 g | 82,000 sheets | none |
| Example 50 | Polymer compound 27 2.0 g | DPHA 0.5 g ATMMT 0.5 g | 85,000 sheets | none |
| Example 51 | Polymer compound 53 1.0 g | DPHA 0.5 g U-2 0.5 g | 81,000 sheets | none |
| Comparative Example 8 | B-2 1.0 g | DPHA 0.5 g U-2 0.5 g | 20,000 sheets | staining |

U-2

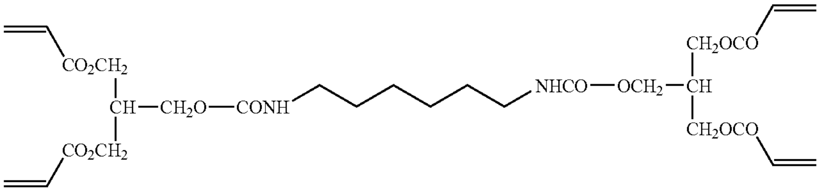

Exposure

The resulting lithographic printing plate originals were subjected to exposure by using Luxel T-9000CTP, manufactured by Fuji Photo Film Co., Ltd., equipped with a multi-channel laser head at an output power per beam of 250 mW, an outer surface drum rotation number of 800 rpm and a resolution of 2,400 dpi.

Developing Treatment

After the exposure, the printing plates were subjected to a developing treatment by using an automatic developing machine STABLON 900N, manufactured by Fuji Photo Film Co., Ltd. The developer solutions, both the charged solution and the replenishing solution, were a 1/8 diluted aqueous solution of DP-4, manufactured by Fuji Photo Film Co., Ltd. The temperature of the developer bath was 30° C. The finisher was a 1/2 diluted aqueous solution of GU-7, manufactured by Fuji Photo Film Co., Ltd.

Evaluation of Printing Durability and Staining

Printing was then carried out by using a printing machine, Heidelberg SOR-KZ. At this time, the number of sheets that could be printed with sufficient ink density was determined using the naked eye to thereby evaluate the printing durability. The staining on the non-image part of the resulting printed matter was evaluated with the naked eye. The results are shown in Table 17.

It is understood from the results of Table 17 that the lithographic printing plates using the image recording material of the invention as the photosensitive layer exhibit no staining on the non-image part and excellent printing durability.

According to this aspect of the invention, such a negative image recording material is provided in which digital data from computers can be directly recorded by recording with a solid laser or a semiconductor laser emitting an infrared ray, and in the case where it is used as a photosensitive layer of a lithographic printing plate original, an image having high strength can be obtained without causing ablation thereby realizing high printing durability.

What is claimed is:

1. A heat mode negative image recording material comprising (A') a polymer compound that is insoluble in water but is soluble in an alkali aqueous solution and has at least one of structural units represented by the following formulae (4) and (5) in an amount of 30 mol % or more; (B), a photothermal conversion agent; and (C') a compound forming radicals by heat mode exposure with light that is capable of being absorbed by the photothermal conversion agent (B), the heat mode negative image recording material being capable of recording an image by heat mode exposure:

formula (4)

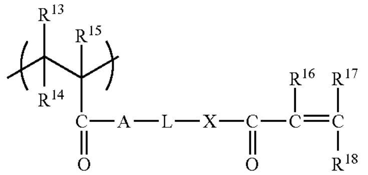

formula (5)

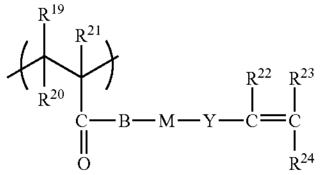

wherein A, B and X each independently represents an oxygen atom, a sulfur atom or —N—($R^{25}$)—; L and M each independently represents a divalent organic group; $R^{13}$ to $R^{24}$ each independently represents a monovalent organic group; Y represents an oxygen atom, a sulfur atom, —N—($R^{26}$)— or a phenylene group, which may have a substituent; and $R^{25}$ and $R^{26}$ each independently represents a hydrogen atom or a monovalent organic group.

2. A heat mode negative image recording material according to claim 1, wherein the image recording material further comprises (D) a radical polymerizable compound.

3. A heat mode negative image recording material according to claim 1, wherein the polymer compound (A') is a poly(meth)acrylate resin.

4. A heat mode negative image recording material according to claim 1, wherein the polymer compound (A') has a weight average molecular weight of from 55,000 to 105,000.

5. A heat mode negative image recording material according to claim 1, wherein L and M in the general formulae (4) and (5) each independently represents a linear alkylene group.

6. A heat mode negative image recording material according to claim 1, wherein the photothermal conversion agent (B) is a cyanine dye.

7. A heat mode negative image recording material according to claim 1, wherein the compound forming radicals (C') is an onium salt compound.

8. A heat mode negative image recording material according to claim 1, wherein the compound forming radicals (C') is a sulfonium salt compound.

9. A lithographic printing plate original that comprises a support and a heat mode negative image recording material of claim 1 provided on the support.

10. A process for making an image on a lithographic printing plate comprising:

(a) forming a heat mode negative image recording material of claim 1;

(b) disposing the heat mode negative image recording material on a support to form a lithographic printing plate original;

(c) exposing the lithographic printing plate original with an infrared laser to form a latent image; and (d) forming an image by using an alkali aqueous solution to develop the latent image.

11. A lithographic printing plate original comprising:

a support and a heat mode negative image recording material provided on the support, the heat mode negative image recording material comprising:

(A') a polymer compound that is insoluble in water but is soluble in an alkali aqueous solution and has at least one of structural units represented by the following formulae (4) and (5) in an amount of 30 mol % or more;

(B) a photothermal conversion agent; and (C') a compound forming radicals by heat mode exposure with light that is capable of being absorbed by the photothermal conversion agent (B), the heat mode negative image recording material being capable of recording an image by heat mode exposure:

formula (4)

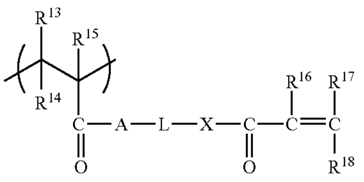

-continued formula (5)

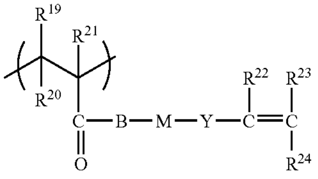

wherein A, B and X each independently represents an oxygen atom, a sulfur atom or —N—($R^{25}$)—; L and M each independently represents a divalent organic group; $R^{13}$ to $R^{24}$ each independently represents a monovalent organic group; Y represents an oxygen atom, a sulfur atom, —N—($R^{26}$)— or a phenylene group, which may have a substituent; and $R^{25}$ and $R^{26}$ each independently represents a hydrogen atom or a monovalent organic group.

12. A process for making an image on a lithographic printing plate comprising:

(a) forming a heat mode negative image recording material comprising:

(A) a polymer compound that is insoluble in water but is soluble in an alkali aqueous solution and has at least one of groups represented by the following formulae (4) and (5) on a side chain;

(B) a photothermal conversion agent; and (C) an onium salt compound forming radicals by heat mode exposure with light that is capable of being absorbed by the photothermal conversion agent (B), the heat mode negative image recording material being capable of recording an image by heat mode exposure, (b) disposing the heat mode negative image recording material on a support to form a lithographic printing plate original, (c) exposing the lithographic printing plate original with an infrared laser to form a latent image and, (d) forming an image by using an alkali aqueous solution to develop the latent image:

formula (4)

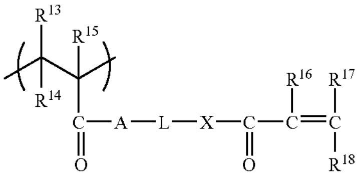

formula (5)

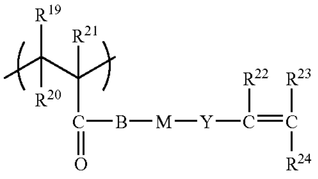

wherein A, B and X each independently represents an oxygen atom, a sulfur atom or —N—($R^{25}$)—; L and M each independently represents a divalent organic group; $R^{13}$ to $R^{24}$ each independently represents a monovalent organic group; Y represents an oxygen atom, a sulfur atom, —N—($R^{26}$)— or a phenylene group, which may have a substituent; and $R^{25}$ and $R^{26}$ each independently represents a hydrogen atom or a monovalent organic group.

* * * * *